US012790682B2

(12) United States Patent
Li et al.

(10) Patent No.: US 12,790,682 B2
(45) Date of Patent: Nov. 10, 2026

(54) INORGANIC SILYL AND POLYSILYL DERIVATIVES OF GROUP V ELEMENTS AND METHODS OF SYNTHESIZING THE SAME AND METHODS OF USING THE SAME FOR DEPOSITION

(71) Applicant: L'Air Liquide, Société Anonyme pour l'Etude et l'Exploitation des Procédés Georges Claude, Paris (FR)

(72) Inventors: Feng Li, San Jose, CA (US); Jean-Marc Girard, Versailles (FR); Peng Zhang, Montvale, NJ (US)

(73) Assignee: L'Air Liquide, Société Anonyme pour l'Etude et l'Exploitation des Procédés Georges Claude, Paris (FR)

(*) Notice: Subject to any disclaimer, the term of this patent is extended or adjusted under 35 U.S.C. 154(b) by 308 days.

(21) Appl. No.: 18/723,052

(22) PCT Filed: Dec. 16, 2022

(86) PCT No.: PCT/US2022/053213
§ 371 (c)(1),
(2) Date: Jun. 21, 2024

(87) PCT Pub. No.: WO2023/121976
PCT Pub. Date: Jun. 29, 2023

(65) Prior Publication Data
US 2025/0066906 A1 Feb. 27, 2025

Related U.S. Application Data

(60) Provisional application No. 63/293,348, filed on Dec. 23, 2021.

(51) Int. Cl.

| | |
|---|---|
| ***C23C 16/18*** | (2006.01) |
| ***C23C 16/455*** | (2006.01) |
| ***C23C 16/52*** | (2006.01) |

(52) U.S. Cl.
CPC ............ *C23C 16/18* (2013.01); *C23C 16/455* (2013.01); *C23C 16/52* (2013.01)

(58) Field of Classification Search
CPC ....... C23C 16/18; C23C 16/455; C23C 16/52; C23C 16/45553; C23C 16/24;
(Continued)

(56) References Cited

U.S. PATENT DOCUMENTS

| | | | |
|---|---|---|---|
| 4,910,153 | A | 3/1990 | Dickson |
| 7,029,995 | B2 | 4/2006 | Todd et al. |

(Continued)

FOREIGN PATENT DOCUMENTS

| | | |
|---|---|---|
| EP | 0 233 613 | 8/1987 |
| WO | WO 02 065508 | 8/2002 |

(Continued)

OTHER PUBLICATIONS

Anderson, J.W. et al., Synthesis and spectra of some silicon arsines, J. Inorg. Nucl. Chem., 1972, vol. 34, 2455-2464.

(Continued)

*Primary Examiner* — Bitew A Dinke
(74) *Attorney, Agent, or Firm* — Yan Jiang

(57) ABSTRACT

Disclosed are Group V element-containing precursors and methods of synthesizing the same and using the same on film depositions. The precursors are $$(SiR_3)_{3-m}A(Si_aH_{2a+1})_m,$$

$$(SiR_3)_{3-n-p}A(Si_aH_{2a+1})_n(Si_bH_{2b+1})_p \text{ or}$$

$$A(Si_aH_{2a+1})(Si_bH_{2b+1})(Si_cH_{2c+1})$$

wherein a=1 to 6; b=1 to 6; c=1 to 6; a≠b≠c;
m=1 to 3;
n=1 to 2, p=1 to 2, n+p=2 to 3;

(Continued)

A=As, P, Sb, Bi; and

R is selected from a $C_1$ to $C_{10}$, linear, branched or cyclic alkyl, alkenyl, alkynyl group. The synthesis methods include one-step, two-step or three-step reaction(s) between halo(poly)silane(s) and a tris(trialkylsilyl) derivative of A or a one-pot mixing reaction between a mixture of two or three halo(poly)silanes and the tris(trialkylsilyl) derivative of A. The deposition methods include CVD, PECVD, ALD, PEALD, flowable CVD, HW-CVD, Epitaxy, or the like.

18 Claims, 4 Drawing Sheets

(58) Field of Classification Search

CPC ......... C23C 16/42; C01B 25/08; C01B 33/04; C07F 9/06; C07F 9/68; C07F 9/902; H10P 14/24; H10P 14/2905; H10P 14/3411; H10P 14/3414; H10P 14/3442

See application file for complete search history.

(56) References Cited

U.S. PATENT DOCUMENTS

| | | | | |
|---|---|---|---|---|
| 9,099,423 | B2 | 8/2015 | Weeks et al. | |
| 2002/0173113 | A1 | 11/2002 | Todd | |
| 2008/0014725 | A1 | 1/2008 | Todd | |
| 2012/0329208 | A1* | 12/2012 | Pore | C23C 16/18 438/758 |
| 2017/0054050 | A1 | 2/2017 | Mader et al. | |
| 2020/0168462 | A1 | 5/2020 | Romero et al. | |
| 2022/0153762 | A1* | 5/2022 | Sanchez | C07F 7/025 |
| 2024/0222114 | A1* | 7/2024 | Fafard | C23C 16/0227 |
| 2025/0051373 | A1* | 2/2025 | Li | C07F 9/00 |

FOREIGN PATENT DOCUMENTS

| | | |
|---|---|---|
| WO | WO 02 065516 | 8/2002 |
| WO | WO 2019 066825 | 4/2019 |

OTHER PUBLICATIONS

Hassler, K. et al., Bis(bis(trimethylsilyl)phosphino)silan $[(Me_3Si)_2P]_2SiH_2$ und 1,2-bis(bis(trimethylsilyl)phosphino) disilan $[(Me_3Si)_2PSiH_{2\,]2}$, Journal of Organometallic Chemistry, 399 (1990) C18-C20.

Amberger, E. et al., Darstellung und Eigenschaftern vos Trisilylarsin, Angew. Chem., 1962, 74, 293.

Amberger, E. et al., The preparation of trisilylphosphine, Angew. Chem. Int. Ed., 1962, 1, 52.

Anderson, J.W. et al., Silicon-phosphorus hydrides. Part IV. The disilylphosphinoaluminate anion, J. Chem. Soc. (A), 1971, 2246-2248.

Aylett, B.J. et al., Phosphine and arsine derivatives of monosilane, J. Inorganic and Nuclear Chemistry, 1955, vol. 1, 187-193.

Chizmeshya, A.V.G. et al., Nano-synthesis approach to the fabrication of monocrystalline silicon-like $(III\text{-}V)_yIV_{5}\text{-}_{2y}$ semiconductors, ECS Transactions, 50 (9) 623-634 (2012).

Cradock, S. et al., Reactions of Tin(IV) chloride with silyl compounds. Part I. Reactions with inorganic silyl compounds, J. Chem. Soc. Dalton Trans., 1975, 1624-1628.

Drake, J.E. et al., Silicon-phosphorus hydrides. Part II. A comparative study by proton magnetic resonance spectroscopy of the isomers disilanyl- and disilyl-phosphine, J. Chem. Soc. (A), 1969, 662-665.

Drake, J.E. et al., Some reactions of monohalogenated hydrides with monosilylphosphine, Inorg. Nucl. Chem. Letters, vol. 4, 1968, 361-363.

Drake, J.E. et al., The reactions of monosilylphosphine with boron trichloride, diborane, and monobromodiborane, Inorganic Chemistry, vol. 6, No. 11, Nov. 1967.

Jiang, L. et al., Nanostructure-property control in $AlPSi_3$/Si(100) semiconductors using direct molecular assembly: theory meets experiment at the atomic level, Chem. Mater. 2014, 26, 4092-4101.

Kouvetakis, J. et al., Monocrystalline $Al(As_1\text{-}_xN_x)Si_3$ and $Al(P_1\text{-}_xN_{x)y}Si_5\text{-}_2$ y alloys with diamond-like structures: new chemical approaches to semiconductors lattice matched to Si, Chem. Mater. 2012, 24, 3219-3230.

Sims, P. et al., Crystalline $(Al_1\text{-}_xB_x)PSi_3$ and $(Al_1\text{-}_xB_x)AsSi_3$ tetrahedral phases via reactions of $Al(BH_{4)3}$ and $M(SiH_{3)3}$ (M=P, As), Chem. Mater. 2015, 27, 8, 3030-3039.

Tice, J.B. et al., Practical routes to $(SiH_{3)3}P$: applications in group IV semiconductor activation and in group III-V molecular synthesis, Dalton Trans., 2010, 39, 4551-4558.

Watkins, T. et al., Nanosynthesis routes to new tetrahedral crystalline solids: silicon-like $Si_3AlP$, J. of Am. Chem. Soc. 2011, 133, 16212-16218.

Wingeleth, D.E. et al., Redistribution of primary silyl- and germylphosphines: synthesis of trisily- and trigermylphosphines, Phosphorus and Sulfur, 1988, vol. 39, 123-129.

International Search Report and Written Opinion for corresponding PCT/US2022/053213, Apr. 25, 2023.

* cited by examiner

INORGANIC SILYL AND POLYSILYL DERIVATIVES OF GROUP V ELEMENTS AND METHODS OF SYNTHESIZING THE SAME AND METHODS OF USING THE SAME FOR DEPOSITION

CROSS REFERENCE TO RELATED APPLICATIONS

This application is a 371 of International PCT Application PCT/US2022/053213, filed Dec. 16, 2022, which claims the benefit of priority to U.S. Provisional Patent Application No. 63/293,348, filed Dec. 23, 2021, the entire contents of which are incorporated herein by reference.

TECHNICAL FIELD

The present invention relates to Group V element-containing precursors and methods of synthesizing the same and methods of using the same in semiconductor film depositions, in particular, to the Group V element-containing precursors having the general formula:

$(SiR_3)_{3-m}A(Si_aH_{2a+1})_m$, or $(SiR_3)_{3-n-p}A(Si_aH_{2a+1})_n(Si_bH_{2b+1})_p$ or $A(Si_aH_{2a+1})(Si_bH_{2b+1})(Si_cH_{2c+1})$ wherein a=1 to 6; b=1 to 6; c=1 to 6; a≠b≠C;

m=1 to 3;

n=1 to 2, p=1 to 2, n+p=2 to 3;

A=As, P, Sb, Bi; and

R is selected from a $C_1$ to $C_{10}$, linear, branched or cyclic alkyl, alkenyl, alkynyl group; to the synthesis methods including one-step, two-step, or three-step reaction(s) between halo(poly)silane(s) and a tris(trialkylsilyl) derivative of A or a one-pot mixing reaction with a mixture of two or three halo(poly)silanes and the tris(trialkylsilyl) derivative of A; and to the methods of deposition Si and Group V element-containing films including CVD, PECVD, ALD, PEALD, flowable CVD, HW-CVD, Epitaxy or the like.

BACKGROUND

Thin films comprising Group V elements are used in various applications, including p-doped Si or SiGe semiconductor channel and contact layers in solid state transistors, non-volatile phase-change memories (PCM), solar cells, III-V compounds and optical storage materials, etc. III-V compound semiconductors can be used in many different application areas, including transistors, optoelectronics and other application areas, for example, in bipolar transistors, field effect transistors, lasers, IR detectors, LEDs, wide band gap semiconductors, quantum well or quantum dot structures, solar cells and in monolithic microwave integrated circuits.

Several III-V semiconductors exhibit features that make them attractive for use in solid-state electronic devices (e.g., high thermal stability, high electron mobility, and low band gap). However, the III-V semiconductors are more difficult to synthesize than the widely used group IV semiconductors, and the lack of suitable routes to the III-V compounds has hindered their acceptance as alternates to the group IV compounds.

Some Group V element-containing compounds (or V compounds) have been made using silyl and polysilyl ligands, namely, $P(SiH_3)_3$, $P(Si_2H_5)_3$, and $As(SiH_3)$, etc. The usage of such compounds for thin film deposition process has been disclosed for $P(SiH_3)_3$ for epitaxial applications (ref) as a phosphorus dopant through forming a interlinked III-V-(IV)3 "building blocks", leading to highly stable and crystalline structures with average diamond-like symmetry.

Related prior art includes the followings.

Tice et al. (Dalton Trans., 2010, 39(19), 4551-4558) disclose $P(SiH_3)_3$ is synthesized by $P(SnMe_3)_3$+3 $SiH_3Br$→$(SiH_3)_3P$+3 $Me_3SnBr$.

Amberger et al. (Angew. Chem. Int. Ed., 1962, 1, 52) disclose $(SiH_3)_3P$ is synthesized by 3 $KPH_2$+3 $SiH_3Br$→$P(SiH_3)_3$+2 $PH_3$+3 KBr at ~55% yield.

Amberger et al. (Angew. Chem., 1962, 74, 293) disclose under mild conditions, $(SiH_3)_3As$ is synthesized and isolated from reactions between 3 $KAsH_2$+3 $SiH_3Br$→$As(SiH_3)_3$+2 $AsH_3$+3 KBr at ~50% yield.

Amberger et al. (Zeitschrift fuer Naturforschung 1963, 18b 157) also disclose the preparation and properties of trisilylstibine, by reacting $Li_3Sb$+$SiH_3Br$ in ether at low temperature, followed by isolation of lights to yield $Sb(SiH_3)_3$ at 77%.

Drake et al. (J. Chem. Soc., 1969, 662-665) disclose the synthesis $P(Si_2)_3$ while reacting proper amount of diborane with $Si_2$—$PH_2$: 3 $SiH_3SiH_2PH_2$→(facilitated by $B_2H_6$) $P(Si_2H_5)_3$+2 $PH_3$.

Drake at al. (Inorg. Chem., 1967, 6(11). 1984-1986; Chem. Ind., 1962, 1470) disclose the synthesis and purification of monosilylphosphoine, such as $SiH_3SiH_2$—$PH_2$, by induced decomposition of monosilane and phosphine mixture in an ozonizer silent electric discharge, followed by trap-to-trap distillation.

Drake et al. (J. Chem. Soc. A., 1968, 2709) disclose the formation of $(GeH_3)_3P$ from $GeH_3PH_2$ disproportionation.

Drake et al. (J. Chem. Soc. A, 1971, 13, 2246) disclose the reaction between $P(SiH_3)_3$ and $LiAlH_4$ would yield as one of the products, e.g., $LiAlH[P(SiH_3)_2]_3$+$Si_2H_5Br$→$Si_2H_5$—$P(SiH_3)_2$.

Drake et al. (Inorg. Nucl. Chem. Letters, 1968, Vol. 4, pp 361-363) disclose monobromogermane reacts with trisilylphosphine to give an 'exchange' resulting in the formation of trigermylphosphine. Monobromosilane reacts with $KMH_2$ (M=P, As, Sb) to give the trisilyl rather than the monosilyl derivatives and monoiodosilane reacts with disilylamine to give a trisilyl species.

Cradock et al. (J. Chem. Soc. A., 1967, 1229) disclose the exchange reaction to form $(GeH_3)_3P$ from $GeH_3Br$—$(SiH_3)_3P$.

Wingeleth et al. (Phosphorus and Sulfur and the related Elements, 1988, 39, 123-9) disclose the formation of $P(SiH_3)_3$, $P(Si_2H_5)_3$, $P(SiH_3)_2(Si_2H_5)$, $P(GeH_3)_3$ through redistribution reactions of monosilyl- or monogermyl-phosphines, including $SiH_3PH_2$, $Si_2H_5PH_2$, $SiH_3PH_2/Si_2H_5PH_2$, and $GeH_3PH_2$, promoted by $BX_3$, $B_2H_6$, and $B_5H_9$.

Beagley et al., (Chem. Commun., 1967, 12, 601-602) disclose the gas phase pyramidal structures of $P(SiH_3)_3$ and $As(SiH_3)_3$.

Yang et al. (Chem. Mater. 2014, 26, 14, 4092-4101) disclose that through low-temperature reactions between $P(SiH_3)_3$ and Al atomic beams, Al—$P(SiH_3)_3$ intermediate formed which contains Al—$PSi_3$ core, which is lately confirmed that it can be deposited and match on Si(100) lattice, and thus presented a practical route to grow III-V material on Group IV semiconductors.

Watkins et al. (J. Am. Chem. Soc. 2011, 133, 40, 16212-16218) disclose the preparation, characterization, and theoretical simulation of tetragonally strained Al—$PSi_3$ core grown on Si(100).

Chizmeshya et al. (ECS Transactions, 2012, 50(9), 623-634) disclose similar application to use molecular beam epitaxy (MBE) techniques at <600° C. to form intermediates with Al—$PSi_3$ core and then incorporated into diamond-shape Group IV materials. In a similar manner, Al—$AsSi_3$ can be deposited using $As(SiH_3)_3$ precursor, as well as a hybrid of P/As, As/N, P/N by forming the corresponding intermediates using a mixture of $As(SiH_3)_3$, $P(SiH_3)_3$, and $N(SiH_3)_3$ to react with Al. The work can be extended to deposition of Al—$PSi_{3x}Ge_{3(1-x)}$ by introducing precursor mixtures of $P(SiH_3)_3$ and $P(GeH_3)_3$.

Sims et al. (Chem. Mater. 2015, 27, 8, 3030-3039) disclose a hybrid of Group III materials, such as $Al_{1-x}B_xPSi_3$ (x=0.04-0.06) formed by low P CVD process using $P(SiH_3)_3$ and $Al(BH_4)_3$ precursors, and grow on Si-based solids.

Kouvetakis et al. (Chem. Mater. 2012, 24, 16, 3219-3230) disclose the use of $M(SiH_3)_3$ (M=P, As) and Al to synthesize (III-V)-(IV) alloys on Si substrates using gas-source MBE. The addition of $N(SiH_3)_3$ into the reaction mixture under appropriate conditions led into novel hybrid materials $Al(As_{1-x}N_x)Si_3$ and $Al(P_{1-x}N_x)_ySi_{5-2y}$.

WO 2019066825/US 20200168462 to Romero et al. disclose the decomposition of Group V (including N, P, As, Sb, and Bi) and/or Group VI (including S, Se, and Te) materials using the corresponding hydrides, and/or silylated species, including silylated phosphine, arsine, stibine, and bismuth, etc.

U.S. Pat. No. 7,029,995 to Todd et al. discloses methods for forming epitaxial films wherein phosphorous, arsenic and antimony are supplied in the form of precursors such as phosphine, trisilylphosphine, arsine, trisilylarsine, stibine, and silylstibine.

U.S. Pat. No. 9,099,423 to Weeks et al. disclose doped semiconductor films and processing wherein the dopant comprises phosphorus.

U.S. Pat. No. 6,716,751 to Todd discloses silicon alloys and doped silicon films formed by CVD and ion implantation processes using Si-containing precursors including $(H_3Si)_{3-x}MRx$, $(H_3Si)_3N$, and $(H_3Si)_4N_2$, wherein R is H or D, x=0, 1 or 2, and M is selected from the group consisting of B, P, As, and Sb.

U.S. Pat. No. 4,910,153 to Dickson discloses deposition precursors having the formula $(MX_3)_nM'X_{4-n}$ wherein M and M' are different Group 4A atoms, at least one of M and M' is silicon, X is hydrogen, halogen or mixtures thereof, and n=1 to 4, inclusive. Dopants having the formula $(SiX_3)_mLX_{3-m}$ wherein L is a Group 5A atom selected from the group of P, As, Sb and Bi, X is hydrogen, halogen or mixtures thereof and m is an integer between 1 and 3, inclusive.

Applications of compounds having a formula $A(SiH_3)_{3-x}(H\ \text{or}\ D)_x$ are described for instance in WO2002065508, specifically when used in combination with a Si source that is a polysilane like disilane or trisilane. This chemistry selection enables to deposit films at a lower temperature than the classical $SiH_4/PH_3/AsH_3$ chemistry used for such process, and thus enables to deposit a film having a higher dopant concentration than the solubility value of the dopant in silicon.

SUMMARY

There is disclosed a method for synthesizing a Group V element-containing compound, the method comprising:

- contacting $A(SiR_3)_3$ with one, two or three types of halo(poly)silane(s) either in series or in a mixture, wherein the halo(poly)silane is selected from the group consisting of X—$Si_aH_{2a+1}$, X—$Si_bH_{2b+1}$ and X—$Si_cH_{2c+1}$; and
- dehalosilylating $A(SiR_3)_3$ to form the Group V element-containing compound $$(SiR_3)_{3-m}A(Si_aH_{2a+1})_m,\ \text{or}$$

$$(SiR_3)_{3-n-p}A(Si_aH_{2a+1})_n(Si_bH_{2b+1})_p\ \text{or}$$

$$A(Si_aH_{2a+1})(Si_bH_{2b+1})(Si_cH_{2c+1})$$

through the stepwise general reaction(s):

a). one-step reaction:

$$A(SiR_3)_3+mX\text{—}Si_aH_{2a+1}\rightarrow(SiR_3)_{3-m}A(Si_aH_{2a+1})_m+mX\text{—}SiR_3,$$

b). two-step reactions:

$$A(SiR_3)_3+nX\text{—}Si_aH_{2a+1}\rightarrow(SiR_3)_{3-n}A(Si_aH_{2a+1})_n+nX\text{—}SiR_3$$

$$(SiR_3)_{3-n}A(Si_aH_{2a+1})_n+pX\text{—}(Si_bH_{2b+1})\rightarrow(SiR_3)_{3-n-p}A(Si_aH_{2a+1})_n(Si_bH_{2b+1})_p+pX\text{—}SiR_3,$$

or c). three-step reactions:

$$A(SiR_3)_3+X\text{—}Si_aH_{2a+1}\rightarrow(SiR_3)_2A(Si_aH_{2a+1})+X\text{—}SiR_3$$

$$(SiR_3)_2A(Si_aH_{2a+1})+X\text{—}Si_bH_{2b+1}\rightarrow(SiR_3)A(Si_aH_{2a+1})(Si_bH_{2b+1})+X\text{—}SiR_3$$

$$(SiR_3)A(Si_aH_{2a+1})(Si_bH_{2b+1})+X\text{—}Si_bH_{2b+1}\rightarrow A(Si_aH_{2a+1})(Si_bH_{2b+1})(Si_cH_{2c+1})+X\text{—}SiR_3;$$

alternatively, through a one-pot reaction with a mixture of two or three halo(poly)silanes:

$$A(SiR_3)_3+xX\text{—}Si_aH_{2a+1}+yX\text{—}Si_bH_{2b+1}+zX\text{—}Si_cH_{2c+1}\rightarrow A(Si_aH_{2a+1})_x(Si_bH_{2b+1})_y(Si_cH_{2c+1})_z(SiR_3)_{(3-x-y-z)}+(x+y+z)X\text{—}SiR_3,$$

wherein

- X=Cl, Br, or I;
- a=1 to 6; b=1 to 6; c=1 to 6; a≠b≠C;
- m=1 to 3;
- n=1 to 2, p=1 to 2, n+p=2 to 3;
- x=0 to 3, y=0 to 3, z=0 to 3, x+y+z=1 to 3;
- A=a Group V element selected from As, P, Sb, Bi; and
- R is selected from a $C_1$ to $C_{10}$, linear, branched or cyclic alkyl, alkenyl, alkynyl group.

The disclosed methods may include one or more of the following aspects:

- a solvent being added;
- the solvent being selected from an alkane or aromatic solvent, a haloalkylsilane or a mixture thereof;
- a ratio of the solvent to $A(SiR_3)_3$ being 0-99 wt %;
- the alkane or aromatic solvent being selected from pentane, hexanes, heptanes, benzene, toluene, xylene, chlorotrimethylsilane, or a mixture thereof;
- a ratio of halo(poly)silane(s) to $A(SiR_3)_3$ ranging from 1:99 to 99:1;
- a ratio of halo(poly)silane(s) to $A(SiR_3)_3$ ranging from 1:20 to 20:1;
- a ratio of halo(poly)silane(s) to $A(SiR_3)_3$ ranging from 1:5 to 5:1;
- X being Cl;
- the halo(poly)silane being a chloro(poly)silane;
- the chloro(poly)silane being Cl—$Si_aH_{2a+1}$, Cl—$Si_bH_{2b+1}$ and/or Cl—$Si_aH_{2a+1}$, wherein a=1 to 6; b=1 to 6; c=1 to 6; a≠b≠c;

the chloro(poly)silane being $Cl—SiH_3$, $Cl—Si_2H_5$, or $Cl—Si_3H_7$;

R being a methyl group (Me);

further comprising separating the solvent and reaction products to isolate the Group V element-containing compound; and purifying the Group V element-containing compound;

a purity of the Group V element-containing compound being >90%;

a purity of the Group V element-containing compound being >95%;

a purity of the Group V element-containing compound being >98%;

the method being a batch process;

the reactions being maintained at a temperature ranging from −20° C. to 150° C.;

the reaction being maintained at a temperature ranging from room temperature to 100° C.;

the Group V element-containing compound containing a trisilyl group;

the trisilyl group being $—SiH(SiH_3)_2$ (i-trisilyl);

the trisilyl group being $—SiH_2—SiH_2—SiH_3$ (n-trisilyl);

the Group V element-containing compound being selected from $P(SiH_3)_3$, $P(SiR_3)(SiH_3)_2$, $P(SiR_3)_2(SiH_3)$, $P(SiR_3)(Si_2H_5)_2$, $P(SiR_3)_2(Si_2H_5)$, $P(Si_2H_5)_3$, $P(SiR_3)(Si_3H_7)_2$, $P(SiR_3)_2(Si_3H_7)$, $P(Si_3H_7)_3$, $As(SiH_3)_3$, $As(SiR_3)(SiH_3)_2$, $As(SiR_3)_2(SiH_3)$, $As(SiR_3)(Si_2H_5)_2$, $As(SiR_3)_2(Si_2H_5)$, $As(Si_2H_5)_3$, $As(SiR_3)(Si_3H_7)_2$, $As(SiR_3)_2(Si_3H_7)$, $As(Si_3H_7)_3$, $Sb(SiH_3)_3$, $Sb(SiR_3)(SiH_3)_2$, $Sb(SiR_3)_2(SiH_3)$, $Sb(SiR_3)(Si_2H_5)_2$, $Sb(SiR_3)_2(Si_2H_5)$, $Sb(Si_2H_5)_3$, $Sb(SiR_3)(Si_3H_7)_2$, $Sb(SiR_3)_2(Si_3H_7)$, $Sb(Si_3H_7)_3$, $P(SiR_3)(SiH_3)(Si_2H_5)$, $P(SiR_3)(SiH_3)(Si_3H_7)$, $P(SiH_3)_2(Si_2H_5)$, $P(SiH_3)_2(Si_3H_7)$, $P(SiH_3)(Si_2H_5)_2$, $P(SiH_3)(Si_2H_5)(Si_3H_7)$, $P(SiH_3)(Si_3H_7)_2$, $P(Si_2H_5)_2(Si_3H_7)$, $P(Si_2H_5)(Si_3H_7)_2$, $As(SiR_3)(SiH_3)(Si_2H_5)$, $As(SiR_3)(SiH_3)(Si_3H_7)$, $As(SiH_3)_2(Si_2H_5)$, $As(SiH_3)_2(Si_3H_7)$, $As(SiH_3)(Si_2H_5)_2$, $As(SiH_3)(Si_2H_5)(Si_3H_7)$, $As(SiH_3)(Si_3H_7)_2$, $As(Si_2H_5)_2(Si_3H_7)$, $As(Si_2H_5)(Si_3H_7)_2$, $Sb(SiR_3)(SiH_3)(Si_2H_5)$, $Sb(SiR_3)(SiH_3)(Si_3H_7)$, $Sb(SiH_3)_2(Si_2H_5)$, $Sb(SiH_3)_2(Si_3H_7)$, $Sb(SiH_3)(Si_2H_5)_2$, $Sb(SiH_3)(Si_2H_5)(Si_3H_7)$, $Sb(SiH_3)(Si_3H_7)_2$, $Sb(Si_2H_5)_2(Si_3H_7)$, or $Sb(Si_2H_5)(Si_3H_7)_2$;

R being selected from Me, Et, nPr, iPr, tBu, nBu, iBu or sBu;

when R=Me, the Group V element-containing compound being selected from $P(SiH_3)_3$, $P(TMS)(SiH_3)_2$, $P(TMS)_2(SiH_3)$, $P(TMS)(Si_2H_5)_2$, $P(TMS)_2(Si_2H_5)$, $P(Si_2H_5)_3$, $P(TMS)(Si_3H_7)_2$, $P(TMS)_2(Si_3H_7)$, $P(Si_3H_7)_3$, $As(SiH_3)_3$, $As(TMS)(SiH_3)_2$, $As(TMS)_2(SiH_3)$, $As(TMS)(Si_2H_5)_2$, $As(TMS)_2(Si_2H_5)$, $As(Si_2H_5)_3$, $As(TMS)(Si_3H_7)_2$, $As(TMS)_2(Si_3H_7)$, $As(Si_3H_7)_3$, $Sb(SiH_3)_3$, $Sb(TMS)(SiH_3)_2$, $Sb(TMS)_2(SiH_3)$, $Sb(TMS)(Si_2H_5)_2$, $Sb(TMS)_2(Si_2H_5)$, $Sb(Si_2H_5)_3$, $Sb(TMS)(Si_3H_7)_2$, $Sb(TMS)_2(Si_3H_7)$, $Sb(Si_3H_7)_3$, $P(TMS)(SiH_3)(Si_2H_5)$, $P(TMS)(SiH_3)(Si_3H_7)$, $P(SiH_3)_2(Si_2H_5)$, $P(SiH_3)_2(Si_3H_7)$, $P(SiH_3)(Si_2H_5)_2$, $P(SiH_3)(Si_2H_5)(Si_3H_7)$, $P(SiH_3)(Si_3H_7)_2$, $P(Si_2H_5)_2(Si_3H_7)$, $P(Si_2H_5)(Si_3H_7)_2$, $As(TMS)(SiH_3)(Si_2H_5)$, $As(TMS)(SiH_3)(Si_3H_7)$, $As(SiH_3)_2(Si_2H_5)$, $As(SiH_3)_2(Si_3H_7)$, $As(SiH_3)(Si_2H_5)_2$, $As(SiH_3)(Si_2H_5)(Si_3H_7)$, $As(SiH_3)(Si_3H_7)_2$, $As(Si_2H_5)_2(Si_3H_7)$, $As(Si_2H_5)(Si_3H_7)_2$, $Sb(TMS)(SiH_3)(Si_2H_5)$, $Sb(TMS)(SiH_3)(Si_3H_7)$, $Sb(SiH_3)_2(Si_2H_5)$, $Sb(SiH_3)_2(Si_3H_7)$, $Sb(SiH_3)(Si_2H_5)_2$, $Sb(SiH_3)(Si_2H_5)(Si_3H_7)$, $Sb(SiH_3)(Si_3H_7)_2$, $Sb(Si_2H_5)_2(Si_3H_7)$, or $Sb(Si_2H_5)(Si_3H_7)_2$;

the Group V element-containing compound being selected from the group consisting of $P(SiH_3)_3$, $P(TMS)(SiH_3)_2$, $P(TMS)_2(SiH_3)$, $P(TMS)(Si_2H_5)_2$, $P(TMS)_2(Si_2H_5)$, $P(Si_2H_5)_3$, $P(TMS)(Si_3H_7)_2$, $P(TMS)_2(Si_3H_7)$, $P(Si_3H_7)_3$, $P(TMS)(SiH_3)(Si_2H_5)$, $P(TMS)(SiH_3)(Si_3H_7)$, $P(SiH_3)_2(Si_2H_5)$, $P(SiH_3)_2(Si_3H_7)$, $P(SiH_3)(Si_2H_5)_2$, $P(SiH_3)(Si_2H_5)(Si_3H_7)$, $P(SiH_3)(Si_3H_7)_2$, $P(Si_2H_5)_2(Si_3H_7)$ and $P(Si_2H_5)(Si_3H_7)_2$;

the Group V element-containing compound being selected from the group consisting of, when n=2 to 3, $A(Si_2H_5)(SiR_3)_2$, $A(Si_3H_7)(SiR_3)_2$, $A(Si_2H_5)_2(SiR_3)$, $A(Si_3H_7)_2(SiR_3)$, $A(Si_2H_5)_3$, and $A(Si_3H_7)_3$, wherein A is a Group V element selected from P, As, Sb or Bi; R is selected from a $C_1$ to $C_{10}$, linear, branched or cyclic alkyl, alkenyl, alkynyl group; provided that if A=P, then $P(SiH_3)_2(Si_2H_5)$, $P(SiH_3)(Si_2H_5)_2$, $P(Si_2H_5)_3$, and $P(SiH_3)_2(TMS)$ are excluded; and the Group V element-containing compound being, when m=3, $A(Si_aH_{2a+1})_3$, wherein a=1 to 6; A is a Group V element selected from P, As, Sb or Bi; R is selected from a $C_1$ to $C_{10}$, linear, branched or cyclic alkyl, alkenyl, alkynyl group; provided that if A=As, then a>1; if A=P, then $P(Si_2H_5)_3$ is excluded; and if A=Sb, then $Sb(SiH_3)_3$ is excluded.

There is also disclosed a Group V element-containing compound, the Group V element-containing compound having the formula:

$$(SiR_3)_{3-m}A(Si_aH_{2a+1})_m,$$

$$(SiR_3)_{3-n-p}A(Si_aH_{2a+1})_n(Si_bH_{2b+1})_p \text{ or}$$

$$A(Si_aH_{2a+1})(Si_bH_{2b+1})(Si_cH_{2c+1})$$

wherein a=1 to 6; b=1 to 6; c=1 to 6; a≠b≠C;

m=1 to 3;

n=1 to 2, p=1 to 2, n+p=2 to 3;

A=a Group V element selected from As, P, Sb, Bi; and

R is selected from a $C_1$ to $C_{10}$, linear, branched or cyclic alkyl, alkenyl, alkynyl group;

provided that if A=As, then $As(SiH_3)_3$ is excluded; if A=P, then $P(SiH_3)_3$, $P(SiH_3)_2(Si_2H_5)$, $P(SiH_3)(Si_2H_5)_2$, $P(Si_2H_5)_3$, and $P(SiH_3)_2(TMS)$ are excluded; and if A=Sb, then $Sb(SiH_3)_3$ is excluded. The disclosed compounds may include one or more of the following aspects:

a purity of the Group V element-containing compound being >93%;

a purity of the Group V element-containing compound being >95%; and a purity of the Group V element-containing compound being >98%.

There is also disclosed a method for forming a Si and Group V element-containing film on a substrate, the method comprising:

exposing the substrate to a vapor of a film-forming composition that contains a Si and Group V element-containing precursor; and depositing at least part of the Si and Group V element-containing precursor onto the substrate to form the Si and Group V element-containing film on the substrate through a vapor deposition method, wherein the Si and Group V element-containing precursor having the general formula $$(SiR_3)_{3-m}A(Si_aH_{2a+1})_m,$$

$$(SiR_3)_{3-n-p}A(Si_aH_{2a+1})_n(Si_bH_{2b+1})_p \text{ or}$$

$$A(Si_aH_{2a+1})(Si_bH_{2b+1})(Si_cH_{2c+1})$$

wherein

A is a Group V element selected from P, As, Sb or Bi;

a=1 to 6; b=1 to 6; c=1 to 6; a≠b≠C;

m=1 to 3;

n=1 to 2, p=1 to 2, n+p=2 to 3;

R is selected from a $C_1$ to $C_{10}$, linear, branched or cyclic alkyl, alkenyl, alkynyl group;

provided that if A=As, then $As(SiH_3)_3$ is excluded; if A=P, then $P(SiH_3)_3$, $P(SiH_3)_2(Si_2H_5)$, $P(SiH_3)(Si_2H_5)_2$, $P(Si_2H_5)_3$, and $P(SiH_3)_2(TMS)$ are excluded; and if A=Sb, then $Sb(SiH_3)_3$ is excluded. The disclosed methods may include one or more of the following aspects:

the Group V element-containing precursor being selected from $P(SiH_3)_3$, $P(SiR_3)(SiH_3)_2$, $P(SiR_3)_2(SiH_3)$, $P(SiR_3)(Si_2H_5)_2$, $P(SiR_3)_2(Si_2H_5)$, $P(Si_2H_5)_3$, $P(SiR_3)(Si_3H_7)_2$, $P(SiR_3)_2(Si_3H_7)$, $P(Si_3H_7)_3$, $As(SiH_3)_3$, $As(SiR_3)(SiH_3)_2$, $As(SiR_3)_2(SiH_3)$, $As(SiR_3)(Si_2H_5)_2$, $As(SiR_3)_2(Si_2H_5)$, $As(Si_2H_5)_3$, $As(SiR_3)(Si_3H_7)_2$, $As(SiR_3)_2(Si_3H_7)$, $As(Si_3H_7)_3$, $Sb(SiH_3)_3$, $Sb(SiR_3)(SiH_3)_2$, $Sb(SiR_3)_2(SiH_3)$, $Sb(SiR_3)(Si_2H_5)_2$, $Sb(SiR_3)_2(Si_2H_5)$, $Sb(Si_2H_5)_3$, $Sb(SiR_3)(Si_3H_7)_2$, $Sb(SiR_3)_2(Si_3H_7)$, $Sb(Si_3H_7)_3$, $P(SiR_3)(SiH_3)(Si_2H_5)$, $P(SiR_3)(SiH_3)(Si_3H_7)$, $P(SiH_3)_2(Si_2H_5)$, $P(SiH_3)_2(Si_3H_7)$, $P(SiH_3)(Si_2H_5)_2$, $P(SiH_3)(Si_2H_5)(Si_3H_7)$, $P(SiH_3)(Si_3H_7)_2$, $P(Si_2H_5)_2(Si_3H_7)$, $P(Si_2H_5)(Si_3H_7)_2$, $As(SiR_3)(SiH_3)(Si_2H_5)$, $As(SiR_3)(SiH_3)(Si_3H_7)$, $As(SiH_3)_2(Si_2H_5)$, $As(SiH_3)_2(Si_3H_7)$, $As(SiH_3)(Si_2H_5)_2$, $As(SiH_3)(Si_2H_5)(Si_3H_7)$, $As(SiH_3)(Si_3H_7)_2$, $As(Si_2H_5)_2(Si_3H_7)$, $As(Si_2H_5)(Si_3H_7)_2$, $Sb(SiR_3)(SiH_3)(Si_2H_5)$, $Sb(SiR_3)(SiH_3)(Si_3H_7)$, $Sb(SiH_3)_2(Si_2H_5)$, $Sb(SiH_3)_2(Si_3H_7)$, $Sb(SiH_3)(Si_2H_5)_2$, $Sb(SiH_3)(Si_2H_5)(Si_3H_7)$, $Sb(SiH_3)(Si_3H_7)_2$, $Sb(Si_2H_5)_2(Si_3H_7)$, or $Sb(Si_2H_5)(Si_3H_7)_2$;

R being selected from Me, Et, nPr, iPr, tBu, nBu, iBu or sBu;

the Si and Group V element-containing precursor being selected from $P(TMS)(SiH_3)_2$, $P(TMS)_2(SiH_3)$, $P(TMS)(Si_2H_5)_2$, $P(TMS)_2(Si_2H_5)$, $P(TMS)(Si_3H_7)_2$, $P(TMS)_2(Si_3H_7)$, $P(Si_3H_7)_3$, $As(TMS)(SiH_3)_2$, $As(TMS)_2(SiH_3)$, $As(TMS)(Si_2H_5)_2$, $As(TMS)_2(Si_2H_5)$, $As(Si_2H_5)_3$, $As(TMS)(Si_3H_7)_2$, $As(TMS)_2(Si_3H_7)$, $As(Si_3H_7)_3$, $Sb(TMS)(SiH_3)_2$, $Sb(TMS)_2(SiH_3)$, $Sb(TMS)(Si_2H_5)_2$, $Sb(TMS)_2(Si_2H_5)$, $Sb(Si_2H_5)_3$, $Sb(TMS)(Si_3H_7)_2$, $Sb(TMS)_2(Si_3H_7)$, $Sb(Si_3H_7)_3$, $P(TMS)(SiH_3)(Si_2H_5)$, $P(TMS)(SiH_3)(Si_3H_7)$, $P(SiH_3)_2(Si_3H_7)$, $P(SiH_3)(Si_2H_5)(Si_3H_7)$, $P(SiH_3)(Si_3H_7)_2$, $P(Si_2H_5)_2(Si_3H_7)$, $P(Si_2H_5)(Si_3H_7)_2$, $As(TMS)(SiH_3)(Si_2H_5)$, $As(TMS)(SiH_3)(Si_3H_7)$, $As(SiH_3)_2(Si_2H_5)$, $As(SiH_3)_2(Si_3H_7)$, $As(SiH_3)(Si_2H_5)_2$, $As(SiH_3)(Si_2H_5)(Si_3H_7)$, $As(SiH_3)(Si_3H_7)_2$, $As(Si_2H_5)_2(Si_3H_7)$, $As(Si_2H_5)(Si_3H_7)_2$, $Sb(TMS)(SiH_3)(Si_2H_5)$, $Sb(TMS)(SiH_3)(Si_3H_7)$, $Sb(SiH_3)_2(Si_2H_5)$, $Sb(SiH_3)_2(Si_3H_7)$, $Sb(SiH_3)(Si_2H_5)_2$, $Sb(SiH_3)(Si_2H_5)(Si_3H_7)$, $Sb(SiH_3)(Si_3H_7)_2$, $Sb(Si_2H_5)_2(Si_3H_7)$, or $Sb(Si_2H_5)(Si_3H_7)_2$;

the Si and Group V element-containing precursor being selected from the group consisting of $P(Si_3H_7)_3$, $P(SiH_3)_2(Si_3H_7)$, $P(SiH_3)(Si_2H_5)_2$, $P(SiH_3)(Si_2H_5)(Si_3H_7)$, $P(SiH_3)(Si_3H_7)_2$, $P(Si_2H_5)_2(Si_3H_7)$ and $P(Si_2H_5)(Si_3H_7)_2$;

the vapor deposition method including a CVD process, an ALD process, an Epitaxy process, or combinations thereof;

the film-forming composition being activated by heating the substrate to a temperature ranging from 200° C. to 1000° C., plasma activating the Si and Group V element-containing precursor, or a combination thereof;

further comprising the step of exposing the substrate to a co-reactant;

the co-reactant being plasma activated;

the co-reactant being not plasma activated;

the co-reactant being an oxygen-containing gas selected from $O_2$, $O_3$, $H_2O$, $H_2O_2$, NO, $N_2O$, $NO_2$, O radicals, alcohol, silanols, aminoalcohols, carboxylic acids, para-formaldehyde, or combinations thereof;

the co-reactant being $O_3$;

the co-reactant being a nitrogen-containing gas selected from $NH_3$, $N_2$, $H_2$, $N_2/H_2$, $H_2$ and $NH_3$, $N_2$ and $NH_3$, $NH_3$ and $N_2H_4$, NO, $N_2O$, amines, trisilylamine, silazanes, or combinations thereof;

the co-reactant being $H_2$;

the co-reactant being $N_2$;

the co-reactant being at least one secondary precursor selected from silanes and polysilanes, alkylsilanes, halosilanes (MCS, DCS, TCS, $SiCl_4$), polyhalopolysilanes, germane, chlorogermane, digermane, polygermanes, halogermanes, phosphines, boranes or halide containing gases;

the co-reactant being a dilution gas selected from Ar, He, $N_2$, $H_2$ or combinations thereof;

the Si and Group V element-containing film being a P-doped silicon-containing film;

further comprising the step of annealing the Si and Group V element-containing layer through thermal annealing, furnace-annealing, rapid thermal annealing, UV or e-beam curing, and/or plasma gas exposure;

the substrate being a powder; and the powder comprising one or more of NMC (Lithium Nickel Manganese Cobalt Oxide), LCO (Lithium Cobalt Oxide), LFP (Lithium Iron Phosphate), and other battery cathode materials.

There is also disclosed a film-forming composition for deposition of a film comprising a Si and Group V element-containing precursor having the formula:

$$(SiR_3)_{3-m}A(Si_aH_{2a+1})_m,$$

$$(SiR_3)_{3-n-p}A(Si_aH_{2a+1})_n(Si_bH_{2b+1})_p \text{ or}$$

$$A(Si_aH_{2a+1})(Si_bH_{2b+1})(Si_cH_{2c+1})$$

wherein

A is a Group V element selected from P, As, Sb or Bi;

a=1 to 6; b=1 to 6; c=1 to 6; a≠b≠C;

m=1 to 3;

n=1 to 2, p=1 to 2, n+p=2 to 3;

R is selected from a $C_1$ to $C_{10}$, linear, branched or cyclic alkyl, alkenyl, alkynyl group;

provided that if A=As, then $As(SiH_3)_3$ is excluded; if A=P, then $P(SiH_3)_3$, $P(SiH_3)_2(Si_2H_5)$, $P(SiH_3)(Si_2H_5)_2$, $P(Si_2H_5)_3$, and $P(SiH_3)_2(TMS)$ are excluded; and if A=Sb, then $Sb(SiH_3)_3$ is excluded. The disclosed film-forming composition includes one or more of the following aspects:

the Group V element-containing precursor being selected from $P(SiH_3)_3$, $P(SiR_3)(SiH_3)_2$, $P(SiR_3)_2(SiH_3)$, $P(SiR_3)(Si_2H_5)_2$, $P(SiR_3)_2(Si_2H_5)$, $P(Si_2H_5)_3$, $P(SiR_3)(Si_3H_7)_2$, $P(SiR_3)_2(Si_3H_7)$, $P(Si_3H_7)_3$, $As(SiH_3)_3$, $As(SiR_3)(SiH_3)_2$, $As(SiR_3)_2(SiH_3)$, $As(SiR_3)(Si_2H_5)_2$, $As(SiR_3)_2(Si_2H_5)$, $As(Si_2H_5)_3$, $As(SiR_3)(Si_3H_7)_2$, $As(SiR_3)_2(Si_3H_7)$, $As(Si_3H_7)_3$, $Sb(SiH_3)_3$, $Sb(SiR_3)(SiH_3)_2$, $Sb(SiR_3)_2(SiH_3)$, $Sb(SiR_3)(Si_2H_5)_2$, $Sb(SiR_3)_2(Si_2H_5)$, $Sb(Si_2H_5)_3$, $Sb(SiR_3)(Si_3H_7)_2$, $Sb(SiR_3)_2(Si_3H_7)$, $Sb(Si_3H_7)_3$, $P(SiR_3)(SiH_3)(Si_2H_5)$, $P(SiR_3)(SiH_3)(Si_3H_7)$, $P(SiH_3)_2(Si_2H_5)$, $P(SiH_3)_2(Si_3H_7)$, $P(SiH_3)(Si_2H_5)_2$, $P(SiH_3)(Si_2H_5)(Si_3H_7)$, $P(SiH_3)(Si_3H_7)_2$, $P(Si_2H_5)_2(Si_3H_7)$, $P(Si_2H_5)(Si_3H_7)_2$, $As(SiR_3)(SiH_3)(Si_2H_5)$, $As(SiR_3)(SiH_3)(Si_3H_7)$, $As(SiH_3)_2(Si_2H_5)$, $As(SiH_3)_2(Si_3H_7)$, $As(SiH_3)(Si_2H_5)_2$, $As(SiH_3)(Si_2H_5)(Si_3H_7)$, $As(SiH_3)(Si_3H_7)_2$, $As(Si_2H_5)_2(Si_3H_7)$, $As(Si_2H_5)(Si_3H_7)_2$, $Sb(SiR_3)(SiH_3)(Si_2H_5)$, $Sb(SiR_3)(SiH_3)(Si_3H_7)$, $Sb(SiH_3)_2(Si_2H_5)$, $Sb(SiH_3)_2(Si_3H_7)$, $Sb(SiH_3)(Si_2H_5)_2$, $Sb(SiH_3)(Si_2H_5)(Si_3H_7)$, $Sb(SiH_3)(Si_3H_7)_2$, $Sb(Si_2H_5)_2(Si_3H_7)$, or $Sb(Si_2H_5)(Si_3H_7)_2$;

R being selected from Me, Et, nPr, iPr, tBu, nBu, iBu or sBu;

the Si and Group V element-containing precursor, when R=Me, being selected from $P(TMS)(SiH_3)_2$, $P(TMS)_2(SiH_3)$, $P(TMS)(Si_2H_5)_2$, $P(TMS)_2(Si_2H_5)$, $P(TMS)(Si_3H_7)_2$, $P(TMS)_2(Si_3H_7)$, $P(Si_3H_7)_3$, $As(TMS)(SiH_3)_2$, $As(TMS)_2(SiH_3)$, $As(TMS)(Si_2H_5)_2$, $As(TMS)_2(Si_2H_5)$, $As(Si_2H_5)_3$, $As(TMS)(Si_3H_7)_2$, $As(TMS)_2(Si_3H_7)$, $As(Si_3H_7)_3$, $Sb(TMS)(SiH_3)_2$, $Sb(TMS)_2(SiH_3)$, $Sb(TMS)(Si_2H_5)_2$, $Sb(TMS)_2(Si_2H_5)$, $Sb(Si_2H_5)_3$, $Sb(TMS)(Si_3H_7)_2$, $Sb(TMS)_2(Si_3H_7)$, $Sb(Si_3H_7)_3$, $P(TMS)(SiH_3)(Si_2H_5)$, $P(TMS)(SiH_3)(Si_3H_7)$, $P(SiH_3)_2(Si_3H_7)$, $P(SiH_3)(Si_2H_5)(Si_3H_7)$, $P(SiH_3)(Si_3H_7)_2$, $P(Si_2H_5)_2(Si_3H_7)$, $P(Si_2H_5)(Si_3H_7)_2$, $As(TMS)(SiH_3)(Si_2H_5)$, $As(TMS)(SiH_3)(Si_3H_7)$, $As(SiH_3)_2(Si_2H_5)$, $As(SiH_3)_2(Si_3H_7)$, $As(SiH_3)(Si_2H_5)_2$, $As(SiH_3)(Si_2H_5)(Si_3H_7)$, $As(SiH_3)(Si_3H_7)_2$, $As(Si_2H_5)_2(Si_3H_7)$, $As(Si_2H_5)(Si_3H_7)_2$, $Sb(TMS)(SiH_3)(Si_2H_5)$, $Sb(TMS)(SiH_3)(Si_3H_7)$, $Sb(SiH_3)_2(Si_2H_5)$, $Sb(SiH_3)_2(Si_3H_7)$, $Sb(SiH_3)(Si_2H_5)_2$, $Sb(SiH_3)(Si_2H_5)(Si_3H_7)$, $Sb(SiH_3)(Si_3H_7)_2$, $Sb(Si_2H_5)_2(Si_3H_7)$, or $Sb(Si_2H_5)(Si_3H_7)_2$;

a purity of the Si and Group V element-containing precursor being >93%;

a purity of the Si and Group V element-containing precursor being >95%; and a purity of the Si and Group V element-containing precursor being >98%.

There is also disclosed a wet film-forming composition for spin coating of a film comprising the disclosed Si and Group V element-containing precursor from formula (I), (II) or (III) that has at least 5 Si atoms. The disclosed wet film-forming compositions may include one or more of the following aspects:

the Si and Group V element-containing precursor from formula (I), (II) or (III) having the lowest volatility being selected to remain in the spun film during the annealing step and decompose in situ;

further comprising a co-reactant being a polysilane or a mixture of polysilanes having 5 or more than 5 silicon atoms;

the polysilane being cyclopentasilane;

the polysilane being cyclohexasilane;

further comprising a solvent;

the spun film is an amorphous or polycrystalline Si film;

the spun film being an amorphous and polycrystalline Si film;

the spun film being an amorphous Si film; and the spun film being a polycrystalline Si film;

There is also disclosed a method for forming a Group V element-doped epitaxial Si film on a substrate, the method comprising:

maintaining the substrate at a predetermined temperature at or near a deposition temperature;

exposing the substrate to a mixture of a vapor of a film-forming composition that contains a Si and Group V element-containing precursor and a vapor of a co-reactant polysilane; and depositing at least part of the Si and Group V element-containing precursor onto the substrate to form the Group V element-doped epitaxial Si film on the substrate through a CVD process, wherein the Si and Group V element-containing precursor having the general formula $$(SiR_3)_{3-m}A(Si_aH_{2a+1})_m,$$

$$(SiR_3)_{3-n-p}A(Si_aH_{2a+1})_n(Si_bH_{2b+1})_p \text{ or}$$

$$A(Si_aH_{2a+1})(Si_bH_{2b+1})(Si_cH_{2c+1})$$

wherein

A is a Group V element selected from P, As, Sb or Bi;

a=1 to 6; b=1 to 6; c=1 to 6; a≠b≠C;

m=1 to 3;

n=1 to 2, p=1 to 2, n+p=2 to 3;

R is selected from a $C_1$ to $C_{10}$, linear, branched or cyclic alkyl, alkenyl, alkynyl group;

provided that if A=As, then $As(SiH_3)_3$ is excluded; if A=P, then $P(SiH_3)_3$, $P(SiH_3)_2(Si_2H_5)$, $P(SiH_3)(Si_2H_5)_2$, $P(Si_2H_5)_3$, and $P(SiH_3)_2(TMS)$ are excluded; and if A=Sb, then $Sb(SiH_3)_3$ is excluded. The disclosed methods may include one or more of the following aspects:

the mixture including a diluted gas selected from Ar, He, $N_2$, $H_2$ or combinations thereof;

the co-reactant polysilane being a germane;

the predetermined temperature ranging from 200° C. to 1000° C.;

the deposition temperature ranging from 200° C. to 1000° C.; and the Group V element-doped epitaxial Si film being a P-doped epitaxial Si film, when A is P.

Notation and Nomenclature

The following detailed description and claims utilize a number of abbreviations, symbols, and terms, which are generally well known in the art. While definitions are typically provided with the first instance of each acronym, such as, stainless steel (SS). Certain abbreviations, symbols, and terms are used throughout the following description and claims, and include the followings.

The following detailed description and claims utilize a number of abbreviations, symbols, and terms, which are generally well known in the art.

As used herein, the indefinite article "a" or "an" means one or more.

As used herein, "about" or "around" or "approximately" in the text or in a claim means ±10% of the value stated.

As used herein, "room temperature" in the text or in a claim means from approximately 20° C. to approximately 25° C.

As used herein, "atmospheric pressure" in the text or in a claim means approximately 1 atm.

The term "substrate" refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from a previous manufacturing step. For example, the wafers may include silicon layers (e.g., crystalline, amorphous, porous, etc.), silicon containing layers (e.g., $SiO_2$, SiN, SiON, SiCOH, etc.), metal containing layers (e.g., copper, cobalt, ruthenium, tungsten, platinum, palladium, nickel, ruthenium, gold, etc.) or combinations thereof. Furthermore, the substrate may be planar or patterned. The substrate may be an organic patterned photoresist film. The substrate may include layers of oxides which are used as dielectric materials in MEMS, 3D NAND, MIM, DRAM, or FeRam device applications (for example, $ZrO_2$ based materials, $HfO_2$ based materials, $TiO_2$ based materials, rare earth oxide based materials, ternary oxide based materials, etc.) or nitride-based films (for example, TaN, TiN, NbN) that are used as electrodes. One of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates.

The term "wafer" or "patterned wafer" refers to a wafer having a stack of films on a substrate and at least the top-most film having topographic features that have been created in steps prior to the deposition of the indium containing film.

The term "aspect ratio" refers to a ratio of the height of a trench (or aperture) to the width of the trench (or the diameter of the aperture).

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

Note that herein, the terms "aperture", "via", "hole" and "trench" may be used interchangeably to refer to an opening formed in a semiconductor structure.

As used herein, the abbreviation "NAND" refers to a "Negative AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

Note that herein, the terms "deposition temperature" and "substrate temperature" may be used interchangeably. It is understood that a substrate temperature may correspond to, or be related to a deposition temperature, and that the deposition temperature may refer to the substrate temperature.

Note that herein, the terms "precursor" and "deposition compound" and "deposition gas" may be used interchangeably when the precursor is in a gaseous state at room temperature and ambient pressure. It is understood that a precursor may correspond to, or be related to a deposition compound or deposition gas, and that the deposition compound or deposition gas may refer to the precursor.

The standard abbreviations of the elements from the periodic table of elements are used herein. It should be understood that elements may be referred to by these abbreviation (e.g., Si refers to silicon, N refers to nitrogen, O refers to oxygen, C refers to carbon, H refers to hydrogen, Hal refers to halogens, which are F, Cl, Br, I).

The unique CAS registry numbers (i.e., "CAS") assigned by the Chemical Abstract Service are provided to identify the specific molecules disclosed.

As used herein, the term "hydrocarbon" refers to a saturated or unsaturated function group containing exclusively carbon and hydrogen atoms.

Please note that the silicon-containing films, such as SiN and SiO, are listed throughout the specification and claims without reference to their proper stoichiometry. The silicon-containing films may include pure silicon (Si) layers, such as crystalline Si, polysilicon (p-Si or polycrystalline Si), or amorphous silicon; silicon nitride ($Si_kN_l$) layers; or silicon oxide ($Si_nO_m$) layers; or mixtures thereof, wherein k, l, m, and n, inclusively range from 0.1 to 6. Preferably, silicon nitride is $Si_kN_l$, where k and l each range from 0.5 to 1.5. More preferably silicon nitride is $Si_3N_4$. Herein, SiN in the following description may be used to represent $Si_kN_l$ containing layers. Preferably silicon oxide is $Si_nO_m$, where n ranges from 0.5 to 1.5 and m ranges from 1.5 to 3.5. More preferably, silicon oxide is $SiO_2$. Herein, SiO in the following description may be used to represent $Si_nO_m$ containing layers. The silicon-containing film could also be a silicon oxide based dielectric material such as organic based or silicon oxide based low-k dielectric materials such as the Black Diamond II or III material by Applied Materials, Inc. with a formula of SiOCH. Silicon-containing film may also include $Si_aO_bN_c$ where a, b, c range from 0.1 to 6. The silicon-containing films may also include dopants from group III, IV, V and VI, such as B, C, P, As and/or Ge.

Please note that the films or layers deposited, such as silicon oxide or silicon nitride, may be listed throughout the specification and claims without reference to their proper stoichiometry (i.e., SiO, $SiO_2$, $Si_3N_4$). The layers may include pure (Si) layers, carbide ($Si_oC_p$) layers, nitride ($Si_kN_l$) layers, oxide ($Si_nO_m$) layers, or mixtures thereof, wherein k, l, m, n, o, and p inclusively range from 1 to 6. For instance, silicon oxide is $Si_nO_m$, wherein n ranges from 0.5 to 1.5 and m ranges from 1.5 to 3.5. More preferably, the silicon oxide layer is SiO or $SiO_2$. The silicon oxide layer may be a silicon oxide based dielectric material, such as organic based or silicon oxide based low-k dielectric materials such as the Black Diamond II or III material by Applied Materials, Inc. Alternatively, any referenced silicon-containing layer may be pure silicon. Any silicon-containing layers may also include dopants, such as B, C, P, As and/or Ge.

As used herein, the abbreviation "Me" refers to a methyl group; the abbreviation "Et" refers to an ethyl group; the abbreviation "Pr" refers to any propyl group (i.e., n-propyl or isopropyl); the abbreviation "iPr" refers to an isopropyl group; the abbreviation "Bu" refers to any butyl group (n-butyl, iso-butyl, tert-butyl, sec-butyl); the abbreviation "tBu" refers to a tert-butyl group; the abbreviation "sBu" refers to a sec-butyl group; the abbreviation "iBu" refers to an iso-butyl group; the abbreviation "Ph" refers to a phenyl group; the abbreviation "Am" refers to any amyl group (iso-amyl, sec-amyl, tert-amyl); the abbreviation "Cy" refers to a cyclic hydrocarbon group (cyclobutyl, cyclopentyl, cyclohexyl, etc.); the abbreviation "Ar" refers to an aromatic hydrocarbon group (phenyl, xylyl, mesityl, etc.); TMS refers to as trimethylsilyl —$SiMe_3$ group.

Ranges may be expressed herein as from about one particular value, and/or to about another particular value. When such a range is expressed, it is to be understood that another embodiment is from the one particular value and/or to the other particular value, along with all combinations within said range. Any and all ranges recited herein are inclusive of their endpoints (i.e., x=1 to 4 or x ranges from 1 to 4 includes x=1, x=4, and x=any number in between), irrespective of whether the term "inclusively" is used.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

BRIEF DESCRIPTION OF THE DRAWINGS

The foregoing and various other aspects, features, and advantages of the present invention, as well as the invention itself, may be more fully appreciated with reference to the following detailed description of the invention when considered in connection with the following drawings. The drawings are presented for the purpose of illustration only and are not intended to be limiting of the invention, in which.

DESCRIPTION OF PREFERRED EMBODIMENTS

Figure 1:
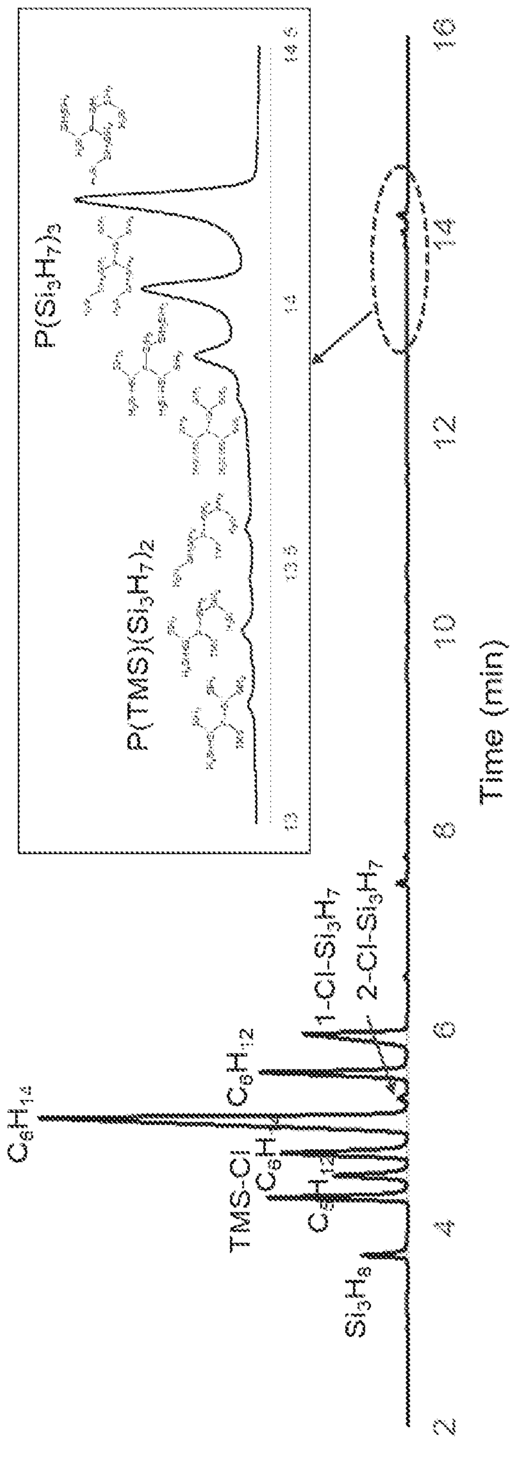
FIG. 1 is GC Chromatogram of reaction mixture of $P(TMS)_3$+7 MCTS (monochlorotrisilane, i.e. $Si_3H_7Cl$) in hexanes at 68° C. for 24 hrs (Example 2)

Disclosed are Group V element-containing film-forming compositions comprising Group V element-containing precursors that contain inorganic silyls and polysilyls, methods of synthesizing them and methods of using them to deposit the Group V element-containing films.

The disclosed Group V element-containing precursors have the general formula:

$$(SiR_3)_{3-m}A(Si_aH_{2a+1})_m, \quad (I)$$

$$(SiR_3)_{3-n-p}A(Si_aH_{2a+1})_n(Si_bH_{2b+1})_p \quad (II)$$

$$A(Si_aH_{2a+1})(Si_bH_{2b+1})(Si_cH_{2c+1}) \quad (III)$$

wherein A is a Group V element selected from P, As, Sb or Bi;

a=1 to 6; b=1 to 6; c=1 to 6; a≠b≠C;

m=1 to 3;

n=1 to 2, p=1 to 2, n+p=2 to 3; and

R is selected from a $C_1$ to $C_{10}$, linear, branched or cyclic alkyl, alkenyl, alkynyl group;

provided that if A=As, then $As(SiH_3)_3$ is excluded; if A=P, then $P(SiH_3)_3$, $P(SiH_3)_2(Si_2H_5)$, $P(SiH_3)(Si_2H_5)_2$, $P(Si_2H_5)_3$, and $P(SiH_3)_2(TMS)$ are excluded; and if A=Sb, then $Sb(SiH_3)_3$ is excluded.

The disclosed Group V element-containing precursors contain a trisilyl group that may either be —$SiH(SiH_3)_2$ (i-trisilyl) or —$SiH_2$—$SiH_2$—$SiH_3$ (n-trisilyl).

Exemplary disclosed precursors include $P(SiH_3)_3$, $P(SiR_3)(SiH_3)_2$, $P(SiR_3)_2(SiH_3)$, $P(SiR_3)(Si_2H_5)_2$, $P(SiR_3)_2(Si_2H_5)$, $P(Si_2H_5)_3$, $P(SiR_3)(Si_3H_7)_2$, $P(SiR_3)_2(Si_3H_7)$, $P(Si_3H_7)_3$, $As(SiH_3)_3$, $As(SiR_3)(SiH_3)_2$, $As(SiR_3)_2(SiH_3)$, $As(SiR_3)(Si_2H_5)_2$, $As(SiR_3)_2(Si_2H_5)$, $As(Si_2H_5)_3$, $As(SiR_3)(Si_3H_7)_2$, $As(SiR_3)_2(Si_3H_7)$, $As(Si_3H_7)_3$, $Sb(SiH_3)_3$, $Sb(SiR_3)(SiH_3)_2$, $Sb(SiR_3)_2(SiH_3)$, $Sb(SiR_3)(Si_2H_5)_2$, $Sb(SiR_3)_2(Si_2H_5)$, $Sb(Si_2H_5)_3$, $Sb(SiR_3)(Si_3H_7)_2$, $Sb(SiR_3)_2(Si_3H_7)$, $Sb(Si_3H_7)_3$, $P(SiR_3)(SiH_3)(Si_2H_5)$, $P(SiR_3)(SiH_3)(Si_3H_7)$, $P(SiH_3)_2(Si_2H_5)$, $P(SiH_3)_2(Si_3H_7)$, $P(SiH_3)(Si_2H_5)_2$, $P(SiH_3)(Si_2H_5)(Si_3H_7)$, $P(SiH_3)(Si_3H_7)_2$, $P(Si_2H_5)_2(Si_3H_7)$, $P(Si_2H_5)(Si_3H_7)_2$, $As(SiR_3)(SiH_3)(Si_2H_5)$, $As(SiR_3)(SiH_3)(Si_3H_7)$, $As(SiH_3)_2(Si_2H_5)$, $As(SiH_3)_2(Si_3H_7)$, $As(SiH_3)(Si_2H_5)_2$, $As(SiH_3)(Si_2H_5)(Si_3H_7)$, $As(SiH_3)(Si_3H_7)_2$, $As(Si_2H_5)_2(Si_3H_7)$, $As(Si_2H_5)(Si_3H_7)_2$, $Sb(SiR_3)(SiH_3)(Si_2H_5)$, $Sb(SiR_3)(SiH_3)(Si_3H_7)$, $Sb(SiH_3)_2(Si_2H_5)$, $Sb(SiH_3)_2(Si_3H_7)$, $Sb(SiH_3)(Si_2H_5)_2$, $Sb(SiH_3)(Si_2H_5)(Si_3H_7)$, $Sb(SiH_3)(Si_3H_7)_2$, $Sb(Si_2H_5)_2(Si_3H_7)$, or $Sb(Si_2H_5)(Si_3H_7)_2$, wherein R is selected from Me, Et, nPr, iPr, tBu, nBu, iBu or sBu.

Preferably, when R is a methyl group, —$CH_3$, the disclosed Group V element-containing precursor is $A(Si_aH_{2a+1})_m(Si(CH_3)_3)_{3-m}$, or $A(Si_nH_{2n+1})_m(TMS)_{3-m}$ wherein a=1 to 6; m=1 to 3; A is a Group V element selected from P, As, Sb or Bi; provided that if A=As, then a>1; A=P, then $P(SiH_3)_2(TMS)$ is excluded; and A=Sb, then $Sb(SiH_3)_3$ is excluded. When R=Me, exemplary disclosed precursors include $P(SiH_3)_3$, $P(TMS)(SiH_3)_2$, $P(TMS)_2(SiH_3)$, $P(TMS)(Si_2H_5)_2$, $P(TMS)_2(Si_2H_5)$, $P(Si_2H_5)_3$, $P(TMS)(Si_3H_7)_2$, $P(TMS)_2(Si_3H_7)$, $P(Si_3H_7)_3$, $As(SiH_3)_3$, $As(TMS)(SiH_3)_2$, $As(TMS)_2(SiH_3)$, $As(TMS)(Si_2H_5)_2$, $As(TMS)_2(Si_2H_5)$, $As(Si_2H_5)_3$, $As(TMS)(Si_3H_7)_2$, $As(TMS)_2(Si_3H_7)$, $As(Si_3H_7)_3$, $Sb(SiH_3)_3$, $Sb(TMS)(SiH_3)_2$, $Sb(TMS)_2(SiH_3)$, $Sb(TMS)(Si_2H_5)_2$, $Sb(TMS)_2(Si_2H_5)$, $Sb(Si_2H_5)_3$, $Sb(TMS)(Si_3H_7)_2$, $Sb(TMS)_2(Si_3H_7)$, $Sb(Si_3H_7)_3$, $P(TMS)(SiH_3)(Si_2H_5)$, $P(TMS)(SiH_3)(Si_3H_7)$, $P(SiH_3)_2(Si_2H_5)$, $P(SiH_3)_2(Si_3H_7)$, $P(SiH_3)(Si_2H_5)_2$, $P(SiH_3)(Si_2H_5)(Si_3H_7)$, $P(SiH_3)(Si_3H_7)_2$, $P(Si_2H_5)_2(Si_3H_7)$, $P(Si_2H_5)(Si_3H_7)_2$, $As(TMS)(SiH_3)(Si_2H_5)$, $As(TMS)(SiH_3)(Si_3H_7)$, $As(SiH_3)_2(Si_2H_5)$, $As(SiH_3)_2(Si_3H_7)$, $As(SiH_3)(Si_2H_5)_2$, $As(SiH_3)(Si_2H_5)(Si_3H_7)$, $As(SiH_3)(Si_3H_7)_2$, $As(Si_2H_5)_2(Si_3H_7)$, $As(Si_2H_5)(Si_3H_7)_2$, $Sb(TMS)(SiH_3)(Si_2H_5)$, $Sb(TMS)(SiH_3)(Si_3H_7)$, $Sb(SiH_3)_2(Si_2H_5)$, $Sb(SiH_3)_2(Si_3H_7)$, $Sb(SiH_3)(Si_2H_5)_2$, $Sb(SiH_3)(Si_2H_5)(Si_3H_7)$, $Sb(SiH_3)(Si_3H_7)_2$, $Sb(Si_2H_5)_2(Si_3H_7)$, $Sb(Si_2H_5)(Si_3H_7)_2$.

Preferably, when n=2 to 3, the disclosed Group V element-containing precursor is selected from the group consisting of $A(Si_2H_5)(SiR_3)_2$, $A(Si_3H_7)(SiR_3)_2$, $A(Si_2H_5)_2(SiR_3)$, $A(Si_3H_7)_2(SiR_3)$, $A(Si_2H_5)_3$, and $A(Si_3H_7)_3$, wherein A is a Group V element selected from P, As, Sb or Bi; R is selected from a $C_1$ to $C_{10}$, linear, branched or cyclic alkyl, alkenyl, alkynyl group; provided that if A=P, then $P(SiH_3)_2(Si_2H_5)$, $P(SiH_3)(Si_2H_5)_2$, $P(Si_2H_5)_3$, and $P(SiH_3)_2(TMS)$ are excluded.

Preferably, when m=3, the disclosed Group V element-containing precursor is $A(Si_aH_{2a+1})_3$, wherein a=1 to 6; A is a Group V element selected from P, As, Sb or Bi; R is selected from a $C_1$ to $C_{10}$, linear, branched or cyclic alkyl, alkenyl, alkynyl group; provided that if A=As, then n>1; if A=P, then $P(Si_2H_5)_3$ is excluded; and if A=Sb, then $Sb(SiH_3)_3$ is excluded.

The disclosed Group V element-containing precursors may be $P(SiH_3)_3$, $P(TMS)(SiH_3)_2$, $P(TMS)_2(SiH_3)$, $P(TMS)(Si_2H_5)_2$, $P(TMS)_2(Si_2H_5)$, $P(Si_2H_5)_3$, $P(TMS)(Si_3H_7)_2$, $P(TMS)_2(Si_3H_7)$, $P(Si_3H_7)_3$, $P(TMS)(SiH_3)(Si_2H_5)$, $P(TMS)(SiH_3)(Si_3H_7)$, $P(SiH_3)_2(Si_2H_5)$, $P(SiH_3)_2(Si_3H_7)$, $P(SiH_3)(Si_2H_5)_2$, $P(SiH_3)(Si_2H_5)(Si_3H_7)$, $P(SiH_3)(Si_3H_7)_2$, $P(Si_2H_5)_2(Si_3H_7)$, or $P(Si_2H_5)(Si_3H_7)_2$.

The disclosed synthesis methods for synthesizing the disclosed Group V element-containing precursors shown in the formula (I) to (III) include a dehalosilylation (DXS) route between a halosilyl or halopolysilyl compound ($X—Si_nH_{2n+1}$) and a tris(trialkylsilyl) derivative of A(A=As, P, Sb or Bi), $A(SiR_3)_3$, according to the general reaction:

$$A(SiR_3)_3+mX—Si_aH_{2a+1}\rightarrow A(Si_aH_{2a+1})_m(SiR_3)_{3-m}+mX—SiR_3 \quad (IV)$$

wherein a=1 to 6;

m=1 to 3, preferably m=3;

A=As, P, Sb, Bi;

X=Cl, Br, I; and

R is selected from a $C_1$ to $C_{10}$, linear, branched or cyclic alkyl, alkenyl, alkynyl group.

The disclosed synthesis methods comprise the steps of contacting $A(SiR_3)_3$ with halo(poly)silane ($X—Si_aH_{2a+1}$), optionally with an addition of a solvent, with a ratio of halo(poly)silane to $A(SiR_3)_3$ ranging from 1 to 100 equiv. to 100 to 1 equiv., preferably from 1 to 20 equiv. to 20 to 1 equiv., preferably halo(poly)silane is chloro(poly)silane. The solvent is inert to both reactants, $A(SiR_3)_3$ and halo(poly)silane ($X—Si_aH_{2a+1}$), selected from an alkane or aromatic solvent, such as pentane, hexane, heptane, benzene, toluene, xylene, etc., or a haloalkylsilane, or mixture thereof, and 0-99 wt % corresponding to the reactants or starting materials, such as $A(SiR_3)_3$. The optimal ratio of halo(poly)silane to $A(SiR_3)_3$ may be optimized to reach the target precursor at the highest yield. For a=1 or 2 in reaction (VI), monochlorosilane (MCS, $ClSiH_3$) or monochlorodisilane (MCDS, $ClSiH_2SiH_3$) may be added using a leak tight manifold, either neat or in a solvent, either by direct liquid addition or by condensation of neat vapors. The mixture of the reactants may then agitated for a period of time, typically 1-168 hrs, to form a reaction mixture. The products may then be separated from the reaction mixture by stripping of the solvent and/or fractional distillation or other suitable means known in the art. The isolated product may then be purified, for instance by distillation, whether batch or continuous, to reach a desired purity of the product.

Here, a ratio of halo(poly)silane to $A(SiR_3)_3$ ranges from 1:99 to 99:1, preferably, from 1:20 to 20:1, more preferably, from 1:10 to 10:1, even more preferably, from 1:5 to 5:1.

The reactions are maintained at a temperature ranging from −20° C. to 150° C., preferably, from room temperature to 100° C. The synthesis time spans from 1 to 168 hrs, preferably from 12 to 96 hrs, more preferably from 24 to 48 hrs, depending on the reaction conditions, such as reaction temperature.

Alternatively, the disclosed synthesis method may be carried out stepwise, and silyl groups of various sizes may be substituted sequentially like two-steps or three step reactions.

The disclosed two-steps reactions with a halosilyl or halopolysilyl compound and a tris(trialkylsilyl) derivative of A have the general reactions:

$$A(SiR_3)_3+nX—Si_aH_{2a+1}\rightarrow(SiR_3)_{3-n}A(Si_aH_{2a+1})_n+nX—SiR_3 \quad (V)$$

$$(SiR_3)_{3-n}A(Si_aH_{2a+1})_n+pX—(Si_bH_{2b+1})\rightarrow A(Si_aH_{2a+1})_{3-n-p}(Si_bH_{2b+1})_p+pX—SiR_3, \quad (VI)$$

wherein a=1 to 6, b=1 to 6;

n=1 to 2, p=1 to 2, n+p=2 to 3;

A=As, P, Sb, Bi;

X=Cl, Br, I; and

R is selected from a $C_1$ to $C_{10}$, linear, branched or cyclic alkyl, alkenyl, alkynyl group.

The disclosed three-steps reactions with a halosilyl or halopolysilyl and a tris(trialkylsilyl) derivative of A have the general reactions:

$$A(SiR_3)_3+X—Si_aH_{2a+1}\rightarrow(SiR_3)_2A(Si_aH_{2a+1})+X—SiR_3 \quad (VII)$$

$$(SiR_3)_2A(Si_aH_{2a+1})+X—Si_bH_{2b+1}\rightarrow(SiR_3)A(Si_aH_{2a+1})(Si_bH_{2b+1})+X—SiR_3 \quad (VIII)$$

$$(SiR_3)A(Si_aH_{2a+1})(Si_bH_{2b+1})+X—Si_bH_{2b+1}\rightarrow A(Si_aH_{2a+1})(Si_bH_{2b+1})(Si_cH_{2c+1})+X—SiR_3 \quad (IX)$$

wherein a=1 to 6, b=1 to 6, c=1 to 6;

A=As, P, Sb, Bi;

X=Cl, Br, I; and

R is selected from a $C_1$ to $C_{10}$, linear, branched or cyclic alkyl, alkenyl, alkynyl group.

Alternatively, the disclosed synthesis method may be carried out in a mixture or in a one-pot, and silyl groups of various sizes may be substituted in the mixture with all starting materials mixed together.

The disclosed mixed reactions with a halosilyl or halopolysilyl and a tris(trialkylsilyl) derivative of A have the general reaction:

$$A(SiR_3)_3+xX—Si_aH_{2a+1}+yX—Si_bH_{2b+1}+zX—Si_cH_{2c+1}\rightarrow A(Si_aH_{2a+1})_x(Si_bH_{2b+1})_y(Si_cH_{2c+1})_z(SiR_3)_{(3-x-y-z)}+(x+y+z)X—SiR_3 \quad (X)$$

wherein a=1 to 6, b=1 to 6, c=1 to 6;

x=0 to 3, y=0 to 3, z=0 to 3, x+y+z=1 to 3;

A=As, P, Sb, Bi;

X=Cl, Br, I; and

R is selected from a $C_1$ to $C_{10}$, linear, branched or cyclic alkyl, alkenyl, alkynyl group.

In one embodiment, the disclosed synthesis method for synthesizing the disclosed Group V element-containing precursors shown in the formula (IV) to (X) is a dechlorosilylation (DCS) route between a chlorosilyl compound, $Cl—Si_aH_{2a+1}$, $Cl—Si_bH_{2b+1}$ and/or $Cl—Si_aH_{2a+1}$, and a tris(trialkylsilyl) derivative of A(A=As, P, Sb or Bi), $A(SiR_3)_3$ (R is selected from a $C_1$ to $C_{10}$, linear, branched or cyclic alkyl, alkenyl, alkynyl group).

The disclosed synthesis reaction may be carried in a batch mode. In this case, $A(SiR_3)_3$ may be added over halo(poly)

silane (e.g., chloro(poly)silane), or vice versa. The addition of halo(poly)silane over $A(SiR_3)_3$ is preferable when only partial substitution of the —$SiR_3$ groups on A is desired.

The disclosed synthesis reaction may be carried out in a continuous mode in which a stream of each reactant is continuously fed and reacted. A continuous mixing system may be used to help contact the reactants. The reaction may not lead to any solid by-products, however, a filtration step may be added after the synthesis to remove potential solid byproducts in case. The volatile side-product(s) of the reaction may be removed continuously to drive the reaction forward towards completion or towards multi-step conversions. This is a unique advantage of the disclosed synthesis methods, which have less to no solid byproduct(s) formed. It is understood that replacing chloro(poly)silane reactant by a bromo(poly)silane does not significantly deviate. For availability reasons, the chlorinated silanes are more convenient.

The disclosed synthesis method has the following unique advantages.

Readily available starting materials: existing synthesis methods use reactants, such as $KPH_2$ and $P(SnMe_3)_3$, which are not readily commercially available, or require fresh preparation. In contrast, the disclosed synthesis methods use $P(TMS)_3$, $As(TMS)_3$, or $Sb(TMS)_3$ as starting materials, which are commercially available in high purity at bulk.

Chlorosilanes are also much more available than their Br counterparts. $SiH_3Cl$ (MCS) is available as a commercial product. For example, $Si_2H_5Cl$ (MCDS) and $Si_3H_7Cl$ (MCTS) may be synthesized according to Cradock et al. (J. Chem. Soc. Dalton Trans., 1975, 1624-1628).

The disclosed synthesis method may be a one-step synthesis if introducing only one type of polysilyl groups. Existing synthesis methods are mostly multi-step reactions, which are mono or di-silyl phosphine, arsine, etc., such as $SiH_3PH_2$, $Si_2H_5PH_2$, and $LiAlH[P(SiH_3)_2]_3$, need to be prepared in the first step(s) followed by isolation. In contrast, the disclosed synthesis method is a one-step and one reactor process, and does not necessarily require isolation of byproducts during the synthesis.

The disclosed synthesis method has mild reaction conditions. Due to the instability of the starting materials, existing synthesis methods mostly require the reactions to be carried out under low temperatures with proper control of reactant addition rate and/or mixture thaw rate. In contrast, the disclosed synthesis method carries out at ambient to slightly elevated temperatures, such as a temperature raging from room temperature to 100° C.

The disclosed synthesis method has less side reactions and a high yield. The disclosed DHS route provides a relatively high yield as a result of less side reactions, which facilitates with isolation and purification processes afterwards.

The disclosed synthesis method has little to no salt formation, which is known to facilitate decomposition of similar molecules, such as its N-based analogs with trisilylamine (TSA) backbone.

The disclosed Group V element containing film-forming precursors synthesized by the disclosed synthesis method may be used for vapor phase depositions of Si-containing films having Group V element dopants in silicon through CVD, PECVD, ALD, PEALD, flowable CVD, HW-CVD, Epitaxy, or the like.

P and As compounds, notably their inorganic derivatives, such as $As(Si_xH_y)_3$, $P(Si_xH_y)_3$, wherein the x and y may be the same or different on each silyl moiety and y=2x+1, may conveniently be used as dopants in silicon. In some applications, there is a strong need for doping beyond the solubility limit of the dopants in silicon, for instance to reduce contact resistance in semiconductor devices. As polysilanes and trisilanes are capable of depositing silicon (e.g., amorphous or crystalline silicon) at a faster rate than silane at a temperature lower than approximately 450° C. The disclosed Group V element-containing precursors having polysilyl ligands instead of silyl ligands would also lead to deposition at lower temperature and facilitate the inclusion of the dopants.

The disclosed Group V element containing precursors are provided in a high purity vessel, typically made of stainless steel, carbon steel, or of aluminium, which has previously been dried down to <100 ppb $H_2O$ residual and which optionally may be passivated to limit decomposition of the precursor therein over time. The passivation process generally involves the exposure of the high purity vessel to a silylating agent, which in this case may be the target precursor itself, or a silane or a polysilane.

The disclosed Group V element-containing precursors have preferably a purity greater than 90% w/w (i.e., 93.0% w/w to 100.0% w/w), preferably greater than 95% w/w (i.e., 98.0% w/w to 100.0% w/w), and more preferably greater than 98% w/w (i.e., 99.0% w/w to approximately 99.999% w/w or 99.0% w/w to 100.0% w/w), with metal impurities in the ppb range and O-containing impurities in the ppm to sub ppm range, consistently with other molecules used for similar applications. The total quantity of impurities is preferably below 5% w/w (i.e., 0.0% w/w to 5.0% w/w), preferably below 2% w/w (i.e., 0.0% w/w to 2.0% w/w), and more preferably below 1% w/w (i.e., 0.0% w/w to 1.0% w/w). The disclosed Group V element-containing precursors may be purified by recrystallization, sublimation, distillation, and/or passing the gas liquid through a suitable adsorbent, such as a molecular sieves.

The disclosed Group V element-containing precursors may be supplied either in neat form or in a blend with a suitable solvent, such as ethyl benzene, xylene, mesitylene, decalin, decane, dodecane, or in a polysilane or a haloalkylsilane. The disclosed precursors may be present in varying concentrations in the solvent.

The vapors of the disclosed Group V element containing precursors may be delivered neat in the absence of a carrier gas into a process chamber when the vapor pressure of the precursor at a vessel temperature ranging from 0° C. to approximately 150° C. is typically >50 torr, preferably >300 torr.

For the disclosed Group V element-containing precursors that have low vapor pressures, the vapors of the disclosed Group V element-containing precursors are fed to the process chamber with a carrier gas in either a bubbler, a vapor draw or a direct liquid injection system. The carrier gas may include, but is not limited to, Ar, He, $N_2$, $H_2$ or a combination thereof. Bubbling with a carrier gas may also remove any dissolved oxygen present in the precursors. The carrier gas and the precursor are then introduced into the processing chamber as a vapor. The process chamber is usually held at a pressure below atmospheric pressure, preferably ranging from 0.01 to 500 torr, and more preferably ranging from 1 to 100 torr.

If necessary, a container containing the disclosed Group V element-containing precursors may be heated or chilled to a temperature that permits the precursors to have a sufficient and adequate vapor pressure. The container may be maintained at temperatures in the range of, for example, approximately 0° C. to approximately 200° C. Those skilled in the art recognize that the temperature of the container may be adjusted in a known manner to control the amount of precursor vaporized.

The processing chamber may be any enclosure chambers within a device in which deposition methods take place such as without limitation, a parallel-plate type reactor, a cold-wall type reactor, a hot-wall type reactor, a single-wafer reactor, a multi-wafer reactor, other types of deposition systems under conditions suitable to cause the precursors to react and form deposited films. One of ordinary skill in the art will recognize that any of these processing chambers may be used for either ALD or CVD deposition processes.

The processing chamber contains one more substrates onto which the films will be deposited. A substrate is generally defined as the material on which a process is conducted. The substrates may be any suitable substrate used in semiconductor, photovoltaic, fiat panel, LCD-TFT device manufacturing. Examples of suitable substrates include wafers, such as silicon, silica, glass, GaAs wafers. The wafer may have one more layers of differing materials deposited on it from a previous manufacturing step. For example, the wafers may include a dielectric layer or 3D NAND stacks. Furthermore, the wafers may include silicon layers (crystalline, amorphous, porous, etc.), silicon oxide layers, silicon nitride layers, silicon oxy nitride layers, carbon doped silicon oxide (SiCOH) layers, metal, metal oxide metal nitride layers (Ti, Ru, Ta, etc.), and combinations thereof. Additionally, the wafers may include copper layers noble metal layers (for example, platinum, palladium, rhodium, gold). The wafers may include barrier layers, such as manganese, manganese oxide, etc. Plastic layers may also be used. The layers may be planar or patterned. The disclosed vapor deposition processes may deposit the layer directly on the wafer or directly on one or more layers on top of the wafer when patterned layers are formed on the substrate. The patterned layers may be alternating layers of two specific layers such as SiO and SiN used in 3D NAND.

The substrate final application is not limited to the present invention, but this technology may find particular benefits for the following types of substrates: silicon wafers, glass wafers and panels, beads, powders and nano-powders, monolithic porous media, printed circuit board, plastic sheets, etc. Exemplary powder substrates include a powder used in rechargeable battery technology. A non-limiting number of powder materials include NMC (Lithium Nickel Manganese Cobalt Oxide), LCO (Lithium Cobalt Oxide), LFP (Lithium Iron Phosphate), and other battery cathode materials.

The temperature and the pressure within the processing chamber are held at conditions suitable for vapor depositions, such as ALD and CVD. In other words, after introduction of the vaporized disclosed Group V element-containing precursor into the chamber, conditions within the chamber are such that at least part of the precursor is deposited onto the substrate to form a layer. For instance, the pressure in the reactor or the deposition pressure may be held between about $10^{-3}$ torr and about 500 torr, preferably between about $10^{-2}$ torr and 500 torr, more preferably between about 1 torr and 100 torr, as required per the deposition parameters. Likewise, the temperature in the reactor or the deposition temperature may be held between room temperature and about 1000° C., preferably between 200° C. and 800° C. One of ordinary skill in the art will recognize that "at least part of the precursor is deposited" means that some all of the precursor reacts with adheres to the substrate.

The temperature to achieve optimal film growth may be controlled by either controlling the temperature of the substrate holder. Devices used to heat the substrate are known in the art. The substrate is heated to a sufficient temperature to obtain the desired film at a sufficient growth rate and with desired physical state and composition. A non-limiting exemplary temperature range to which the substrate may be heated includes from approximately 200° C. to approximately 800° C. When a plasma deposition process is utilized, the deposition temperature is preferably less than 500° C. Alternatively, when a thermal process is performed, the deposition temperature may range from 200° C. to approximately 800° C.

Alternatively, the substrate may be heated to a sufficient temperature to obtain the desired deposited film at a sufficient growth rate and with desired physical state and composition. The substrate(s) temperature may be maintained at a temperature ranging from approximately 200° C. to 1000° C., preferably between 200° C. and 800° C., and more preferably between 250 and 600° C.

More specifically, in addition to the disclosed Group V element-containing precursors, other precursors or co-reactants may also be introduced into the processing chamber, such as, but are not limited to $H_2$, silanes, polysilanes ($Si_2$ to $Si_6$, linear, branched or cyclic for $Si_5$ and $Si_6$), alkylsilanes such as monomethylsilane, halosilanes ($Cl—SiH_3$, $Cl_2SiH_2$, $I_2—SiH_2$, $Cl_3SiH$, $SiCl_4$ etc.) and polyhalopolysilanes ($Si_2Cl_6$, $Si_2HCl_5$, $Cl—Si_2H_5$, etc.), germane, chlorogermanes, digermane, polygermanes, halogermanes, phosphines, boranes such as $B_2H_6$, diboranes, halide containing gases (HCl, $Cl_2$, HBr, etc.); N-containing gases ($NH_3$, $N_2$, $N_2/H_2$, $H_2$ and $NH_3$, $N_2$ and $NH_3$, $NH_3$ and $N_2H_4$, NO, $N_2O$, amines, trisilylamine, silazanes, etc., or combinations thereof); O-containing gases ($O_2$, $O_3$, $H_2O$, $H_2O_2$, NO, $N_2O$, $NO_2$, O radicals, alcohol, silanols, aminoalcohols, carboxylic acids, para-formaldehyde, etc., and combinations thereof).

Furthermore, a dilution gas may be added to the process, and is selected from Ar, He, $N_2$, $H_2$ or combinations thereof.

Furthermore, the co-reactants may be treated by a plasma, in order to decompose the precursor or reactant into its radical form, at least one of $H_2$, $N_2$ and $O_2$ or an inert gas (He, Ar, Kr, Xe) may be utilized depending on the target film composition, when treated with plasma. The plasma source may be a $N_2$ plasma, $N_2$/He plasma, $N_2$/Ar plasma, $NH_3$ plasma, $NH_3$/He plasma, $NH_2$/AR plasma, He plasma, Ar plasma, $H_2$ plasma, $H_2$/He plasma, $H_2$/organic amine plasma, and mixtures thereof. For instance, the plasma may be generated with a power ranging from about 10 W to about 1000 W, preferably from about 50 W to about 500 W. The plasma may be generated present within the reactor itself. Alternatively, the plasma may generally be at a location removed from the reactor, for instance, in a remotely located plasma system. One of skill in the art will recognize methods and apparatus suitable for such plasma treatment.

For example, the co-reactants may be introduced into a direct plasma reactor, which generates plasma in the reaction chamber, to produce the plasma-treated reactant in the processing chamber. Exemplary direct plasma reactors include the Titan™ PECVD System produced by Trion Technologies. The co-reactants may be introduced and held in the processing chamber prior to plasma processing. Alternatively, the plasma processing may occur simultaneously with the introduction of the precursor or reactant. In-situ plasma is typically a 13.56 MHz RF inductively coupled plasma that is generated between the showerhead and the substrate holder. The substrate and the showerhead may be the powered electrode depending on whether positive ion impact occurs. Typical applied powers in in-situ plasma generators are from approximately 30 W to approximately 1000 W. Preferably, powers from approximately 30 W to approximately 600 W are used in the disclosed methods. More preferably, the powers range from approximately 100 W to approximately 500 W. The disassociation of the co-reactants using in-situ plasma is typically less than achieved using a remote plasma source for the same power input and is therefore not as efficient in reactant dissociation as a remote plasma system, which may be beneficial for the deposition of films on substrates easily damaged by plasma.

Alternatively, the plasma-treated co-reactants may be produced outside of the processing chamber, for example, a remote plasma to treat the co-reactants prior to passage into the processing chamber.

The vapor deposition process may be selective to certain surfaces or non-selective.

The vapor deposition process may be thermally driven, or enhanced by plasma activation, light activation, microwave activation, or other suitable means to activate the molecule and the growth process.

The disclosed Group V element-containing film-forming compositions may be used to deposit films using any deposition methods known to those of skill in the art. Examples of suitable vapor deposition methods include CVD and ALD. Exemplary CVD methods include thermal CVD, plasma enhanced CVD (PECVD), pulsed CVD (PCVD), low pressure CVD (LPCVD), sub-atmospheric CVD (SACVD) atmospheric pressure CVD (APCVD), hot-wire CVD (HWCVD, also known as cat-CVD, in which a hot wire serves as an energy source for the deposition process), radicals incorporated CVD, and combinations thereof. Exemplary ALD methods include thermal ALD, plasma enhanced ALD (PEALD), spatial ALD, hot-wire ALD (HWALD), radicals incorporated ALD, and combinations thereof. The deposition method is preferably a hot wall or cold wall thermal CVD capable of depositing epitaxial films or amorphous films containing Si and the dopant element of the claimed compound, and optionally Ge and/or other co-dopants.

In ALD processes, ALD conditions within the chamber allow the disclosed Group V element-containing film-forming composition adsorbed or chemisorbed on the substrate surface to react and form a film on the substrate. In some embodiments, Applicants believe that plasma-treating co-reactant may provide the co-reactant with the energy needed to react with the disclosed Group V element-containing film-forming composition (PEALD). The co-reactant may be treated with plasma prior subsequent to introduction into the chamber.

The Group V element-containing precursors and co-reactants may be introduced into the reactor sequentially (ALD). The processing chamber may be purged with an inert gas between the introduction of each of the Group V element-containing precursors, any additional precursors, and the co-reactants. Another example is to introduce the co-reactant continuously and to introduce the Group V element-containing precursors by pulse, while activating the co-reactant sequentially with a plasma, provided that the Group V element-containing precursors and the non-activated co-reactant do not substantially react at the chamber temperature and pressure conditions (CW PEALD).

Each pulse of the disclosed Group V element-containing precursors may last for a time period ranging from about 0.01 seconds to about 120 seconds, alternatively from about 1 seconds to about 80 seconds, alternatively from about 5 seconds to about 30 seconds. The co-reactant may also be pulsed into the reactor, In such embodiments, the pulse of each may last for a time period ranging from about 0.01 seconds to about 120 seconds, alternatively from about 1 seconds to about 30 seconds, alternatively from about 2 seconds to about 20 seconds. In another alternative, the vaporized Group V element-containing precursors and co-reactants may be simultaneously sprayed from different sectors of a showerhead without mixing under which a susceptor holding several wafers is spun (spatial ALD).

Depending on the particular process parameters, deposition may take place for a varying length of time. Generally, deposition may be allowed to continue as long as desired necessary to produce a film with the necessary properties. Typical film thicknesses may vary from several angstroms to several hundreds of microns, and typically from 2 to 100 nm, depending on the specific deposition process. The deposition process may also be performed as many times as necessary to obtain the desired film.

The disclosed Group V element-containing precursors and co-reactants may be introduced into the reactor either simultaneously (CVD), sequentially (ALD) or different combinations thereof. The reactor may be purged with an inert gas (for example, $N_2$, Ar, Kr, Xe) between the introduction of the Group V element-containing precursors and the introduction of the co-reactant. Alternatively, the co-reactant and the Group V element-containing precursors may be mixed together to form a co-reactant/compound mixture, and then introduced to the reactor in a mixture form (CVD, thermal CVD or Epitaxy). Another example is to introduce the co-reactant continuously and to introduce the disclosed Group V element-containing precursors by pulse (pulsed CVD).

The desired film thickness may range from a molecular monolayer to 10 μm, preferably between 1 nm and 500 nm.

Depending on the co-reactants, the deposition process may contain other elements than those present in the claimed precursors, such as Ge, Ga, C, B, Sn, Al, N, O, S, Se, Te, In, Zn, Cd, Hg.

The deposited film using the disclosed deposition methods may be p-doped Si and Group V element-containing film.

The deposited film using the disclosed deposition methods may be Group V element doped silicon layer, such as P doped silicon layer.

The disclosed Group V element-containing film-forming compositions may be used for liquid phase film deposition of Si containing films, including but not limited to spin coating, dip coating or spray coating. In this case, a formulation containing the disclosed compound is coated on a substrate, which is subsequently annealed to yield a thin film.

The disclosed Group V element-containing film-forming compositions are particularly useful as doping ingredients for formulations aiming at making amorphous and polycrystalline Si films. Such formulations typically comprise a large polysilane or mixture of polysilanes having > or =5 silicon atoms (cyclopentasilane, cyclohexasilane, etc.) and a solvent. After coating of the substrate with the formulation, the films are treated to yield a silicon film. For such spin coating applications, the selected precursors should have the lowest volatility to remain in the spun film during the annealing step and decompose in situ. Precursors of the family having at least 5 Si atoms are typically suitable for such applications.

The treatment typically includes heating (200 to 1000° C.) or/and light/UV exposure. In such formulations, the disclosed Group V element-containing compounds may be added at a ratio of 0.01% to 50% (by weight) to yield a doped silicon film.

Formulations containing the disclosed Group V element-containing precursors may also be used to make doped silicon oxide films by any of the aforementioned wet coating method by using an oxidative curing after the coating of the surface. Typical oxidative curing uses at least one of $H_2O$ (vapor), $O_2$, $O_3$, $H_2O_2$ and plasma thereof (and optionally an inert gas), at a temperature ranging from room temperature to 1000° C. Preferably, the curing includes a 2-step process: a soft bake at a temperature ranging from room temperature to 250° C., and a hardbake a temperature ranging from 250° C. to 1000° C. The hardbake step may be carried with or without an oxidizing gas. For these wet coating applications, it is advantageous to use a fully inorganic and low volatility precursor, preferably selected from $A(Si_xH_{2x+1})_3$, wherein x is 2 or more and A=As or P.

EXAMPLES

The following non-limiting examples are provided to further illustrate embodiments of the invention. However, the examples are not intended to be all-inclusive and are not intended to limit the scope of the inventions described herein.

Example 1. Synthesis of $(TMS)_2P(Si_3H_7)$

In a 20 mL vial, 3 g Cl—$Si_3H_7$ MCTS was added under magnetic stirring, into a solution of 11 g of $P(TMS)_3$ 10 wt % in hexanes. The reaction mixture was stirred under an inert atmosphere at RT for 5 days, during which all $P(TMS)_3$ was converted into a majority of $P(TMS)_2(Si_3H_7)$ at 68% yield.

Example 2. Synthesis & Characterization of $P(Si_3H_7)_3$ 25 g $P(TMS)_3$ was dissolved in 200 g anhydrous hexanes in a 500 mL flask under inert atmosphere, followed by addition of 75 g monochlorotrisilane MCTS slowly with magnetic stirring. The reaction mixture was refluxed at 68° C. for 24 hrs, during which all $P(TMS)_3$ was converted into $P(Si_3H_7)_3$ at 93% yield. FIG. 1 is GC Chromatogram of reaction mixture of $P(TMS)_3$+7 MCTS in hexanes at 68° C. for 24 hrs.

Example 3. Synthesis of $(TMS)P(SiH_3)_2$ 5 g of $P(TMS)_3$ 10 wt % in hexanes was charged into a 60 mL stainless steel vessel. 2.6 g monochlorosilane MCS was cryotrapped into the vessel. The reaction mixture was thawed and shaked at 150 rpm in the sealed vessel at 75° C. for 24 hrs, during which all $P(TMS)_3$ was converted into a majority of $P(TMS)(SiH_3)_2$ at 59% yield.

Example 4. Synthesis of $P(SiH_3)_3$ 5.6 g of $P(TMS)_3$ was charged into a 60 mL stainless steel vessel. 6.9 g monochlorosilane MCS was cryotrapped into the vessel. The reaction mixture was thawed and shaked at 150 rpm in the sealed vessel at 90° C. for 48 hrs, during which all $P(TMS)_3$ was converted into a majority of $P(SiH_3)_3$ at 85% yield.

Figure 2:
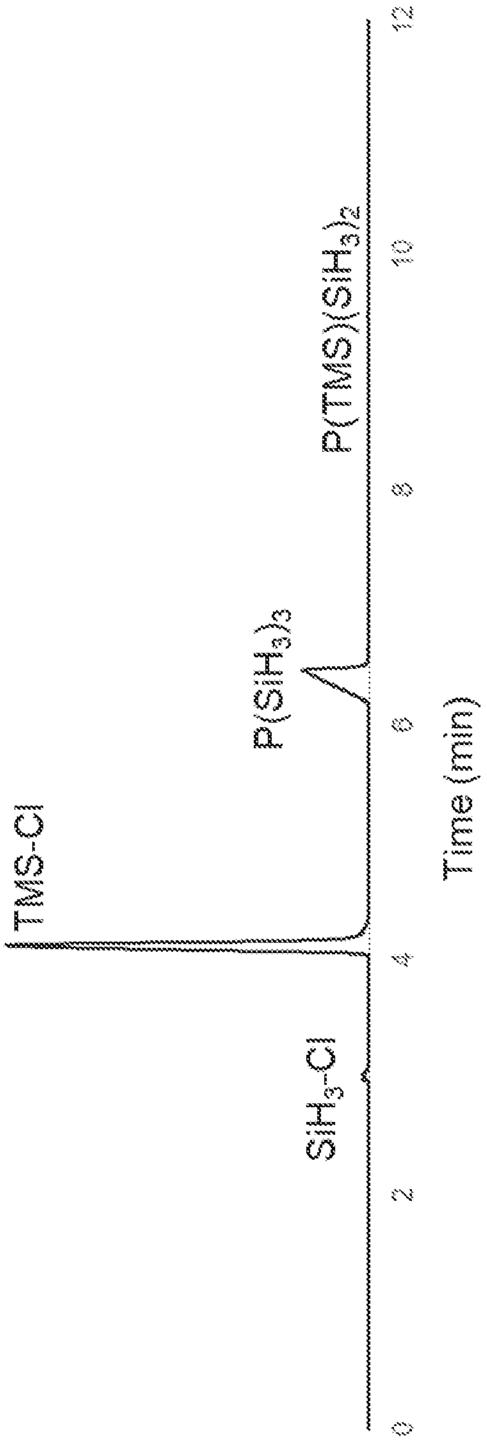
FIG. 2 is GC Chromatogram of reaction mixture of $P(TMS)_3$+3 MCS (monochlorosilane, i.e. $SiH_3Cl$) at 90° C. for 44 hrs (Example 4)

235 g of $P(TMS)_3$ was charged into a leak tight 600 mL Parr reactor. 183 g monochlorosilane MCS was cryotrapped into the vessel. The reaction mixture was thawed and vigorously stirred at 400 rpm at 90° C. for 44 hrs, during which all $P(TMS)_3$ was converted into a majority of $P(SiH_3)_3$ at 92% yield. FIG. 2 is GC Chromatogram of reaction mixture of $P(TMS)_3$+3 MCS at 90° C. for 44 hrs.

Example 5. Synthesis of $As(Si_3H_7)_3$

Figure 3:
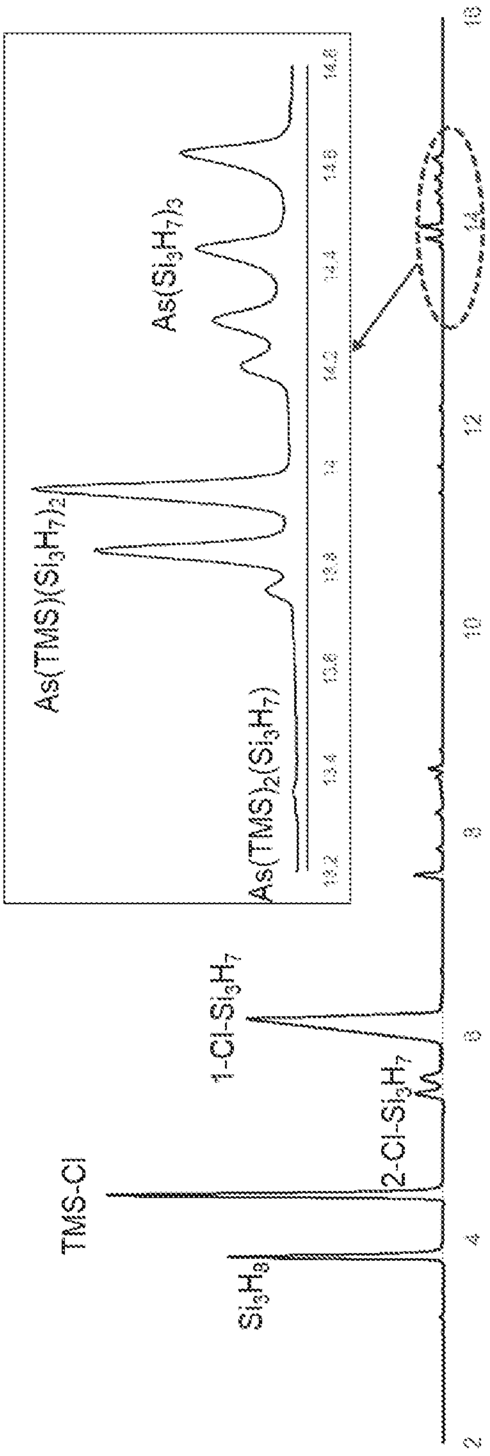
FIG. 3 is GC Chromatogram of reaction mixture of $As(TMS)_3$+6 MCTS at 60° C. for 24 hrs (Example 5)

Heating at 90° C. and shaking at 150 rpm for 48 hrs of the mixture of 2 g of $As(TMS)_3$ and 7.5 g MCTS in a 60 mL stainless steel vessel leads to exclusively $As(Si_3H_7)_3$ at 75% yield. FIG. 3 is GC Chromatogram of reaction mixture (in Example 5) of $As(TMS)_3$+6 MCTS at 60° C. for 24 hrs.

Example 6. Synthesis of $As(SiH_3)(TMS)_2$ 4.5 g of $As(TMS)_3$ was charged into a 60 mL stainless steel vessel. 8.5 g monochlorosilane MCS was cryotrapped into the vessel. The reaction mixture was thawed and shaked at 150 rpm in the sealed vessel at 90° C. for 24 hrs, during which a majority of $As(SiH_3)(TMS)_2$ was obtained at 52% yield.

Example 7. Synthesis of $Sb(Si_3H_7)(TMS)_2$ $Sb(Si_3H_7)(TMS)_2$ may be synthesized at 72% yield by reacting 2 g $Sb(TMS)_3$ and MCTS 7 g at R.T. under vigorously magnetic stirring for one day. Heating at elevated temperatures (e.g. 50° C. or 90° C.) will lead to decomposition.

Figure 4:
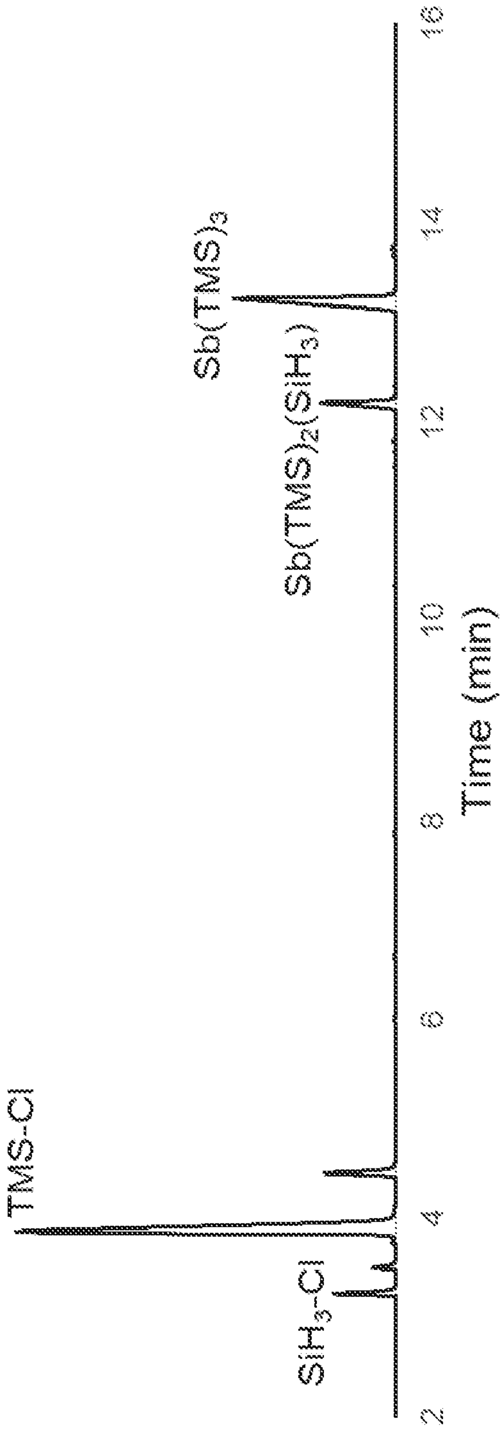
FIG. 4 is GC Chromatogram of reaction mixture of $Sb(TMS)_3$+10 MCS at 60° C. for 24 hrs (Example 8).

Example 8. Synthesis of $Sb(SiH_3)(TMS)_2$ 2.8 g of $Sb(TMS)_3$ was charged into a 60 mL stainless steel vessel. 9 g monochlorosilane MCS was cryotrapped into the vessel. The reaction mixture was thawed and shaked at 150 rpm in the sealed vessel at 60° C. for 24 hrs, during which a majority of $Sb(SiH_3)(TMS)_2$ was obtained at 23% yield. FIG. 4 is GC Chromatogram of reaction mixture of $Sb(TMS)_3$+10 MCS at 60° C. for 24 hrs.

Example 9. Synthesis of $P(Si_2H_5)_3$ 5 g of $P(TMS)_3$ 10 wt % in hexanes was charged into a 60 mL stainless steel vessel. 2.2 g monochlorodisilane MCDS was added into the vessel. The reaction mixture was shaked at 150 rpm in the sealed vessel at 60° C. for 24 hrs, during which $P(Si_2H_5)_3$ formed at 22% yield.

Example 10. Isolation of $P(SiH_3)_3$ 380 g synthesis mixture, which contains a product profile as 26% $P(SiH_3)_3$ in TMS-Cl solution, was added into a 500 mL round bottom flask inside a glovebox. Standard fractional distillation was then carried out. After volatiles were removed at 55-70° C., the main cut is collected under ambient pressure, whose vapor phase temperature is in the range of 115-125° C., 75 g $P(SiH_3)_3$ at 98% purity is obtained, which represents a 76% overall yield. Further distillation or distillation with a higher separation efficiency is expected to achieve a preferably >99% for industrial applications.

Prophetic Example 1: Synthesis of $P(SiH_3)_2(Si_3H_7)$ 10 g of $P(TMS)(SiH_3)_2$ (e.g., synthesized by Example 3) 30 wt % in TMS-Cl was charged into a 60 mL stainless steel vessel. 2.0 g MCTS was added into the vessel. The reaction mixture was shaked at 150 rpm in the sealed vessel at 75° C. for 24 hrs, during which $P(SiH_3)_2(Si_3H_7)$ formed as the major product.

Prophetic Example 2: Synthesis of $P(SiH_3)(Si_2H_5)_2$ 118 g of $P(TMS)_3$ was charged into a leak tight 600 mL Parr reactor. 31 g monochlorosilane MCS was cryotrapped into the vessel. The reaction mixture was thawed and vigorously stirred at 400 rpm at 75° C. for 24 hrs, during which all $P(TMS)_3$ was converted into a majority of $P(SiH_3)(TMS)_2$.

10 g of $P(SiH_3)(TMS)_2$ ~25 wt % in TMS-Cl was charged into a 60 mL stainless steel vessel. 2.4 g MCDS was added into the vessel. The reaction mixture was shaked at 150 rpm in the sealed vessel at 60° C. for 40 hrs, during which $P(SiH_3)(Si_2H_5)_2$ formed as the major product.

Prophetic Example 3. CVD of P Doped Si Layer Using Precursor $P(Si_3H_7)_3$

P doped Si layer is attempted to be deposited on Si(100) substrates. $P(Si_3H_7)_3$ vapor was introduced into a deposition reactor (heated to ~500° C.) at a flow rate of 10 sccm and approximately a pressure of about 1-20 torr for 10-20 minutes, during which a thickness of 500-1500 Å polycrystalline P doped silicon film is obtained. SEM images may be acquired of the resulting P doped silicon film. An energy dispersive analysis of X-rays (EDAX) detector may be used to acquire elemental analysis. AFM, XRD and ellipsometric measurements of the resulting P doped silicon films deposited on Si(100) surfaces may be performed. Other various characterization techniques such as atomic absorption (AA), MS-GC, NMR, FT-IR, neutron activation analysis (NAA), energy dispersive analysis by X-rays (EDAX), Rutherford back-scattering analysis (RBS), and X-ray analyses may be used for characterizing the deposited film.

Prophetic Example 4: Thermal CVD of High Quality P Doped Si Layers on a Si(100) Wafer Using Precursor $P(SiH_3)_2(Si_3H_7)$ Pre-etched Si(100) substrate by dilute HF acid, and properly conditioned (rinse and dried), is loaded into a deposition chamber, followed by a $H_2$ baking at 800-1000° C. under a flow of 50-120 slm. The substrate and the chamber is then equilibriumed at 400-600° C. at 20-50 torr back pressure. Pure $H_2$ gas is then bubbled through the liquid precursor $P(SiH_3)_2(Si_3H_7)$ to deliver a vapor of $P(SiH_3)_2(Si_3H_7)/H_2$ mixture into the reactor chamber at a flow rate of 50-150 sccm for 1-5 minutes. A highly crystalline, P-doped epitaxial Si film at the thickness of approximately 30-150 Å is deposited on the Si(100) wafer. Hydrogen residue may be confirmed as no presence by RBS.

Prophetic Example 5: Thermal CVD of P Doped Si Film on a Si(100) Wafer Using Precursor $P(SiH_3)(Si_3H_7)_2$ with High Throughput Pre-etched Si(100) substrate by dilute HF acid, and properly conditioned (rinse and dried), is loaded into a deposition chamber, followed by a $H_2$ baking at 800-1000° C. under a flow of 50-120 slm. The substrate and the chamber is then equilibriumed at approximately 550° C. at 50 torr back pressure. Pure $H_2$ gas is then bubbled through the liquid precursor $P(SiH_3)(Si_3H_7)_2$ equilibriumed at approximately 75° C., and through trisilane at room temperature into a mixing chamber at ~100° C., followed by introducing the vapor of $P(SiH_3)(Si_3H_7)_2/Si_3H_8/H_2$ mixture into the reactor chamber at a flow rate of approximately 100 sccm for 3 minutes. A highly crystalline, P-doped epitaxial Si film at the thickness of approximately 200 Å is deposited on the Si(100) wafer.

Although the subject matter described herein may be described in the context of illustrative implementations to process one or more computing application features/operations for a computing application having user-interactive components the subject matter is not limited to these particular embodiments. Rather, the techniques described herein may be applied to any suitable type of user-interactive component execution management methods, systems, platforms, and/or apparatus.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. A method for forming a Si and Group V element-containing film on a substrate, the method comprising:

exposing the substrate to a vapor of a film-forming composition that contains a Si and Group V element-containing precursor; and depositing at least part of the Si and Group V element-containing precursor onto the substrate to form the Si and Group V element-containing film on the substrate through a vapor deposition method, wherein the Si and Group V element-containing precursor having the general formula $$(SiR_3)_{3-m}A(Si_aH_{2a+1})_m,$$

$$(SiR_3)_{3-n-p}A(Si_aH_{2a+1})_n(Si_bH_{2b+1})_p \text{ or}$$

$$A(Si_aH_{2a+1})(Si_bH_{2b+1})(Si_cH_{2c+1})$$

wherein

A is a Group V element selected from P, As, Sb or Bi;

a=1 to 6; b=1 to 6; c=1 to 6; a≠b≠c;

m=1 to 3;

n=1 to 2, p=1 to 2, n+p=2 to 3;

R is selected from a $C_1$ to $C_{10}$, linear, branched or cyclic alkyl, alkenyl, alkynyl group;

provided that if A=As, then $As(SiH_3)_3$ is excluded; if A=P, then $P(SiH_3)_3$, $P(SiH_3)_2(Si_2H_5)$, $P(SiH_3)(Si_2H_5)_2$, $P(Si_2H_5)_3$, and $P(SiH_3)_2(TMS)$ are excluded; and if A=Sb, then $Sb(SiH_3)_3$ is excluded.

2. The method of claim 1, wherein the Group V element-containing precursor is selected from $P(SiH_3)_3$, $P(SiR_3)(SiH_3)_2$, $P(SiR_3)_2(SiH_3)$, $P(SiR_3)(Si_2H_5)_2$, $P(SiR_3)_2(Si_2H_5)$, $P(Si_2H_5)_3$, $P(SiR_3)(Si_3H_7)_2$, $P(SiR_3)_2(Si_3H_7)$, $P(Si_3H_7)_3$, $As(SiH_3)_3$, $As(SiR_3)(SiH_3)_2$, $As(SiR_3)_2(SiH_3)$, $As(SiR_3)(Si_2H_5)_2$, $As(SiR_3)_2(Si_2H_5)$, $As(Si_2H_5)_3$, $As(SiR_3)(Si_3H_7)_2$, $As(SiR_3)_2(Si_3H_7)$, $As(Si_3H_7)_3$, $Sb(SiH_3)_3$, $Sb(SiR_3)(SiH_3)_2$, $Sb(SiR_3)_2(SiH_3)$, $Sb(SiR_3)(Si_2H_5)_2$, $Sb(SiR_3)_2(Si_2H_5)$, $Sb(Si_2H_5)_3$, $Sb(SIR_3)(Si_3H_7)_2$, $Sb(SiR_3)_2(Si_3H_7)$, $Sb(Si_3H_7)_3$, $P(SiR_3)(SiH_3)(Si_2H_5)$, $P(SiR_3)(SiH_3)(Si_3H_7)$, $P(SiH_3)_2(Si_2H_5)$, $P(SiH_3)_2(Si_3H_7)$, $P(SiH_3)(Si_2H_5)_2$, $P(SiH_3)(Si_2H_5)(Si_3H_7)$, $P(SiH_3)(Si_3H_7)_2$, $P(Si_2H_5)_2(Si_3H_7)$, $P(Si_2H_5)(Si_3H_7)_2$, $As(SiR_3)(SiH_3)(Si_2H_5)$, $As(SiR_3)(SiH_3)(Si_3H_7)$, $As(SiH_3)_2(Si_2H_5)$, $As(SiH_3)_2(Si_3H_7)$, $As(SiH_3)(Si_2H_5)_2$, $As(SiH_3)(Si_2H_5)(Si_3H_7)$, $As(SiH_3)(Si_3H_7)_2$, $As(Si_2H_5)_2(Si_3H_7)$, $As(Si_2H_5)(Si_3H_7)_2$, $Sb(SiR_3)(SiH_3)(Si_2H_5)$, $Sb(SiR_3)(SiH_3)(Si_3H_7)$, $Sb(SiH_3)_2(Si_2H_5)$, $Sb(SiH_3)_2(Si_3H_7)$, $Sb(SiH_3)(Si_2H_5)_2$, $Sb(SiH_3)(Si_2H_5)(Si_3H_7)$, $Sb(SiH_3)(Si_3H_7)_2$, $Sb(Si_2H_5)_2(Si_3H_7)$, or $Sb(Si_2H_5)(Si_3H_7)_2$, wherein R is selected from Me, Et, nPr, iPr, tBu, nBu, iBu or sBu.

3. The method of claim 2, wherein the Si and Group V element-containing precursor is selected from, when R is Me, $P(TMS)(SiH_3)_2$, $P(TMS)_2(SiH_3)$, $P(TMS)(Si_2H_5)_2$, $P(TMS)_2(Si_2H_5)$, $P(TMS)(Si_3H_7)_2$, $P(TMS)_2(Si_3H_7)$, $P(Si_3H_7)_3$, $As(TMS)(SiH_3)_2$, $As(TMS)_2(SiH_3)$, $As(TMS)(Si_2H_5)_2$, $As(TMS)_2(Si_2H_5)$, $As(Si_2H_5)_3$, $As(TMS)(Si_3H_7)_2$, $As(TMS)_2(Si_3H_7)$, $As(Si_3H_7)_3$, $Sb(TMS)(SiH_3)_2$, $Sb(TMS)_2(SiH_3)$, $Sb(TMS)(Si_2H_5)_2$, $Sb(TMS)_2(Si_2H_5)$, $Sb(Si_2H_5)_3$, $Sb(TMS)(Si_3H_7)_2$, $Sb(TMS)_2(Si_3H_7)$, $Sb(Si_3H_7)_3$, $P(TMS)(SiH_3)(Si_2H_5)$, $P(TMS)(SiH_3)(Si_3H_7)$, $P(SiH_3)_2(Si_3H_7)$, $P(SiH_3)(Si_2H_5)(Si_3H_7)$, $P(SiH_3)(Si_3H_7)_2$, $P(Si_2H_5)_2(Si_3H_7)$, $P(Si_2H_5)(Si_3H_7)_2$, $As(TMS)(SiH_3)(Si_2H_5)$, $As(TMS)(SiH_3)(Si_3H_7)$, $As(SiH_3)_2(Si_2H_5)$, $As(SiH_3)_2(Si_3H_7)$, $As(SiH_3)(Si_2H_5)_2$, $As(SiH_3)(Si_2H_5)(Si_3H_7)$, $As(SiH_3)(Si_3H_7)_2$, $As(Si_2H_5)_2(Si_3H_7)$, $As(Si_2H_5)(Si_3H_7)_2$, $Sb(TMS)(SiH_3)(Si_2H_5)$, $Sb(TMS)(SiH_3)(Si_3H_7)$, $Sb(SiH_3)_2(Si_2H_5)$, $Sb(SiH_3)_2(Si_3H_7)$, $Sb(SiH_3)(Si_2H_5)_2$, $Sb(SiH_3)(Si_2H_5)(Si_3H_7)$, $Sb(SiH_3)(Si_3H_7)_2$, $Sb(Si_2H_5)_2(Si_3H_7)$, or $Sb(Si_2H_5)(Si_3H_7)_2$.

4. The method of claim 1, wherein the Si and Group V element-containing precursor is selected from the group consisting of $P(Si_3H_7)_3$, $P(SiH_3)_2(Si_3H_7)$, $P(SiH_3)(Si_2H_5)_2$, $P(SiH_3)(Si_2H_5)(Si_3H_7)$, $P(SiH_3)(Si_3H_7)_2$, $P(Si_2H_5)_2(Si_3H_7)$ and $P(Si_2H_5)(Si_3H_7)_2$.

5. The method of claim 1, wherein the film-forming composition is activated by heating the substrate to a temperature ranging from 200° C. to 1000° C., plasma activating the Si and Group V element-containing precursor, or a combination thereof.

6. The method of claim 1, further comprising the step of exposing the substrate to a co-reactant, wherein the co-reactant is either plasma activated or not plasma activated.

7. The method of claim 1, further comprising the step of annealing the Si and Group V element-containing layer through thermal annealing, furnace-annealing, rapid thermal annealing, UV or e-beam curing, and/or plasma gas exposure.

8. The method of claim 1, wherein the Si and Group V element-containing film is a P-doped silicon-containing film.

9. A film-forming composition for deposition of a film comprising a Si and Group V element-containing precursor having the formula:

$$(SiR_3)_{3-m}A(Si_aH_{2a+1})_m,$$

$$(SiR_3)_{3-n-p}A(Si_aH_{2a+1})_n(Si_bH_{2b+1})_p \text{ or}$$

$$A(Si_aH_{2a+1})(Si_bH_{2b+1})(Si_cH_{2c+1})$$

wherein

A is a Group V element selected from P, As, Sb or Bi;

a=1 to 6; b=1 to 6; c=1 to 6; a≠b≠c;

m=1 to 3;

n=1 to 2, p=1 to 2, n+p=2 to 3;

R is selected from a $C_1$ to $C_{10}$, linear, branched or cyclic alkyl, alkenyl, alkynyl group;

provided that if A=As, then $As(SiH_3)_3$ is excluded; if A=P, then $P(SiH_3)_3$, $P(SiH_3)_2(Si_2H_5)$, $P(SiH_3)(Si_2H_5)_2$, $P(Si_2H_5)_3$, and $P(SiH_3)_2(TMS)$ are excluded; and if A=Sb, then $Sb(SiH_3)_3$ is excluded.

10. The composition of claim 9, wherein a purity of the Si and Group V element-containing precursor is >98%.

11. A wet film-forming composition for spin coating of a film comprising the Si and Group V element-containing precursors of claim 9 that has at least 5 Si atoms.

12. The wet film-forming composition of claim 11, wherein the Si and Group V element-containing precursors of claim 9 having the lowest volatility are selected to remain in a spun film during an annealing step and decompose in situ.

13. The wet film-forming composition of claim 11, further comprising a co-reactant being a polysilane or a mixture of polysilanes having 5 or more than 5 silicon atoms.

14. The wet film-forming composition of claim 11, wherein the polysilane is cyclopentasilane or cyclohexasilane.

15. The wet film-forming composition of claim 11, wherein the spun film is an amorphous or polycrystalline Si film.

16. A method for forming a Group V element-doped epitaxial Si film on a substrate, the method comprising:

maintaining the substrate at a predetermined temperature at or near a deposition temperature;

exposing the substrate to a mixture of a vapor of a film-forming composition that contains a Si and Group V element-containing precursor and a vapor of a co-reactant polysilane; and depositing at least part of the Si and Group V element-containing precursor onto the substrate to form the Group V element-doped epitaxial Si film on the substrate through a CVD process, wherein the Si and Group V element-containing precursor having the general formula:

$$(SiR_3)_{3-m}A(Si_aH_{2a+1})_m,$$

$$(SiR_3)_{3-n-p}A(Si_aH_{2a+1})_n(Si_bH_{2b+1})_p \text{ or}$$

$$A(Si_aH_{2a+1})(Si_bH_{2b+1})(Si_cH_{2c+1})$$

wherein

A is a Group V element selected from P, As, Sb or Bi;

a=1 to 6; b=1 to 6; c=1 to 6; a≠b≠C;

m=1 to 3;

n=1 to 2, p=1 to 2, n+p=2 to 3;

R is selected from a $C_1$ to $C_{10}$, linear, branched or cyclic alkyl, alkenyl, alkynyl group;

provided that if A=As, then $As(SiH_3)_3$ is excluded; if A=P, then $P(SiH_3)_3$, $P(SiH_3)_2(Si_2H_5)$, $P(SiH_3)(Si_2H_5)_2$, $P(Si_2H_5)_3$, and $P(SiH_3)_2(TMS)$ are excluded; and if A=Sb, then $Sb(SiH_3)_3$ is excluded.

17. The method of claim 16, wherein the co-reactant polysilane is a germane.

18. The method of claim 16, wherein the predetermined temperature and the deposition temperature range from 200° C. to 1000° C.

* * * * *